US012610554B2

(12) United States Patent
Sharma et al.

(10) Patent No.: US 12,610,554 B2
(45) Date of Patent: Apr. 21, 2026

(54) MULTI-STORAGE ELEMENT SINGLE-TRANSISTOR CROSSPOINT MEMORY SYSTEMS AT LOW TEMPERATURES

(71) Applicant: Intel Corporation, Santa Clara, CA (US)

(72) Inventors: Abhishek Anil Sharma, Portland, OR (US); Wilfred Gomes, Portland, OR (US); Anand Murthy, Portland, OR (US); Sagar Suthram, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/856,878

(22) Filed: Jul. 1, 2022

(65) Prior Publication Data

US 2024/0008286 A1     Jan. 4, 2024

(51) Int. Cl.
| | |
|---|---|
| *H10B 53/20* | (2023.01) |
| *H01L 23/522* | (2006.01) |
| *H01L 23/528* | (2006.01) |
| *H10D 30/01* | (2025.01) |
| *H10D 30/69* | (2025.01) |

(52) U.S. Cl.
CPC ......... *H10B 53/20* (2023.02); *H01L 23/5226* (2013.01); *H01L 23/5283* (2013.01); *H10D 30/0415* (2025.01); *H10D 30/701* (2025.01)

(58) Field of Classification Search
CPC .. H10B 53/20; H10D 30/0415; H10D 30/701; H01L 23/5226; H01L 23/5283

USPC .......................................................... 257/295
See application file for complete search history.

(56) References Cited

U.S. PATENT DOCUMENTS

| | | | |
|---|---|---|---|
| 2006/0289942 A1* | 12/2006 | Horii .................. | H10N 70/8836 |
| | | | 438/210 |
| 2021/0159229 A1 | 5/2021 | Gomes et al. | |
| 2021/0257366 A1 | 8/2021 | Lee | |
| 2021/0280761 A1 | 9/2021 | Kim et al. | |
| 2022/0077151 A1 | 3/2022 | Lee | |

OTHER PUBLICATIONS

Intel Corporation WO 2019117904 A1 Vertical Thyristors for Cross-Point Dynamic Memories (Year: 2019).*
Frougier, Julien et al., "Introducing the world's first 2nm node chip," published May 6, 2021 (https://research.ibm.com/blog/2-nm-chip).

* cited by examiner

*Primary Examiner* — Tu-Tu V Ho
(74) *Attorney, Agent, or Firm* — Essential Patents Group, LLP

(57)        ABSTRACT

Bits are stored in an array with multiple storage elements sharing a single access transistor and a storage line coupled to the transistor. A single common select transistor accesses information stored in an array of storage elements. Other arrays of storage elements on parallel storage lines can be coupled into a crosspoint array by source lines orthogonal to the storage lines. The storage elements may be non-volatile. In an integrated circuit system, the array may be coupled to a power supply and a cooling structure.

19 Claims, 13 Drawing Sheets

101

100

110

300

Receive a
substrate with a transistor
310

Form storage line
320

Form storage elements
330

Form lower electrode layer
332

Form storage layer
334

Form upper electrode layer
336

Remove portions of first electrode layer, storage layer, and
second electrode layer
338

Form source lines
340

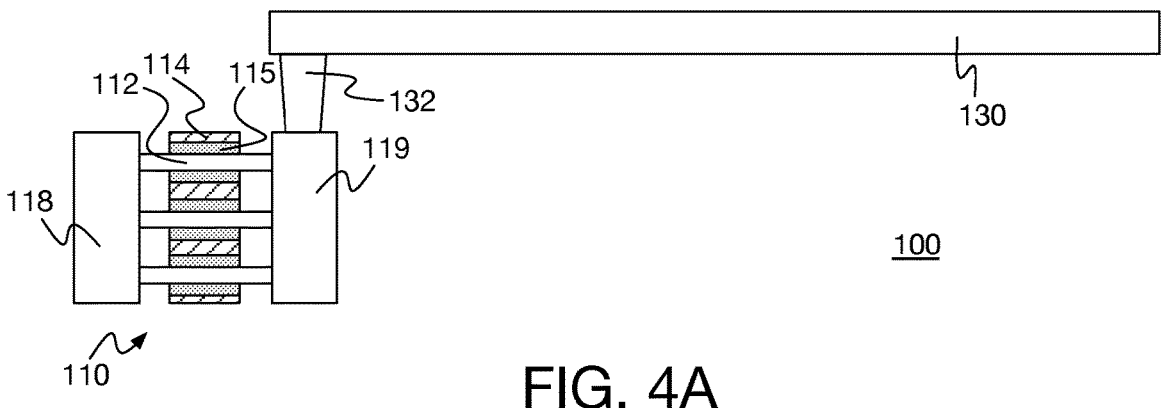
FIG. 4A
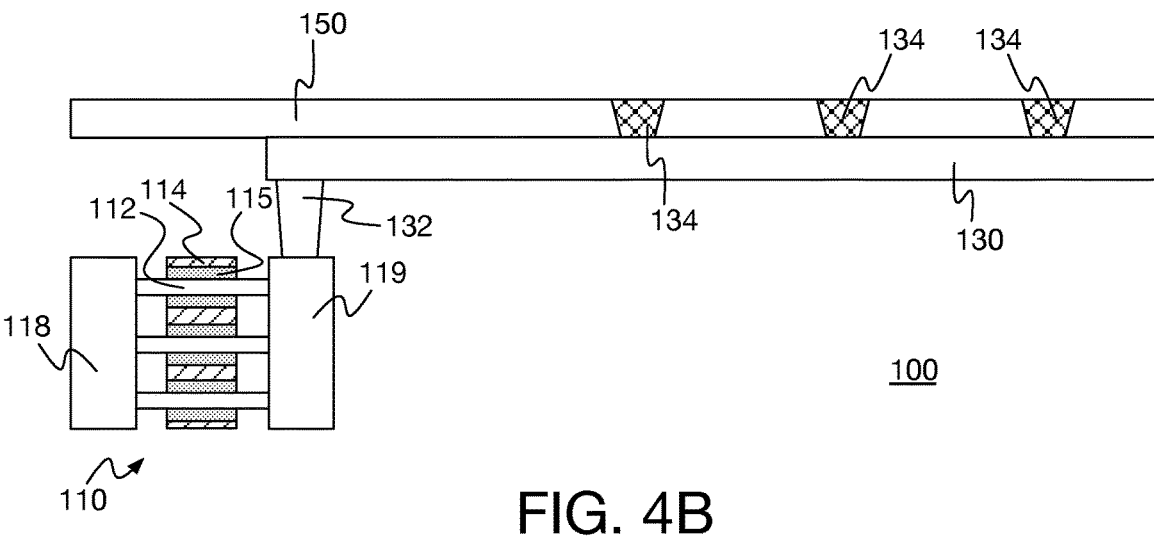
FIG. 4B
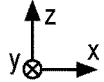

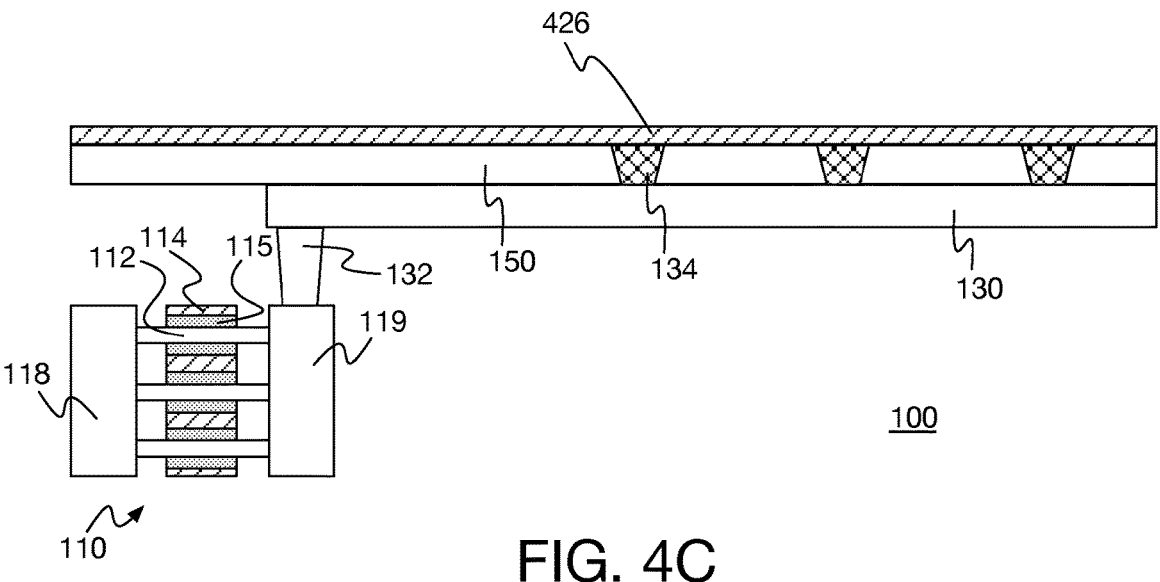
FIG. 4C
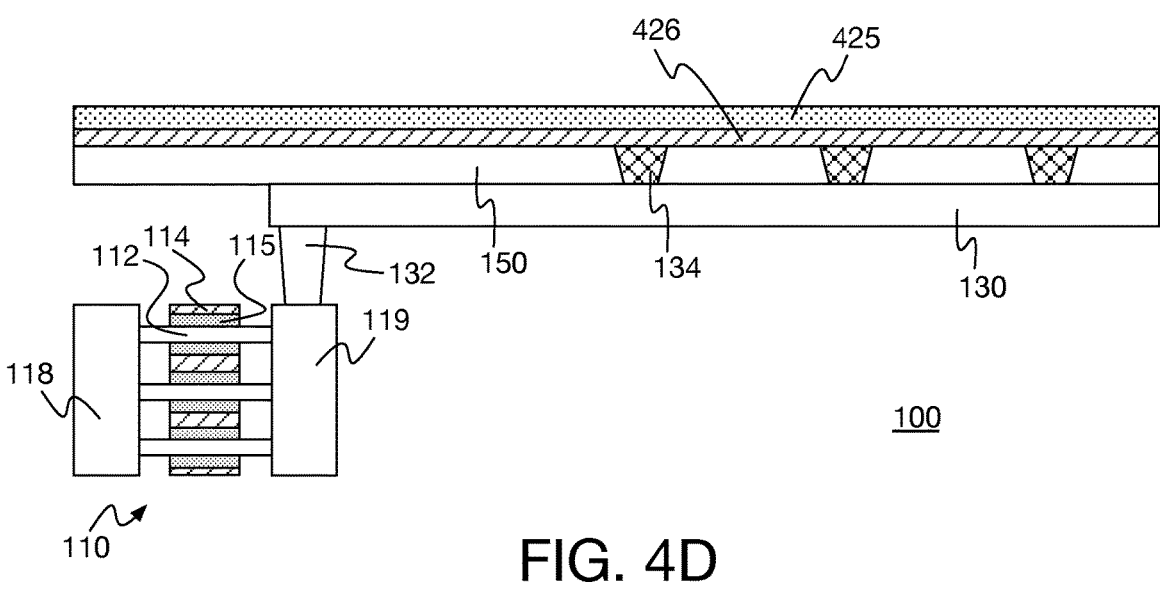
FIG. 4D
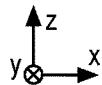

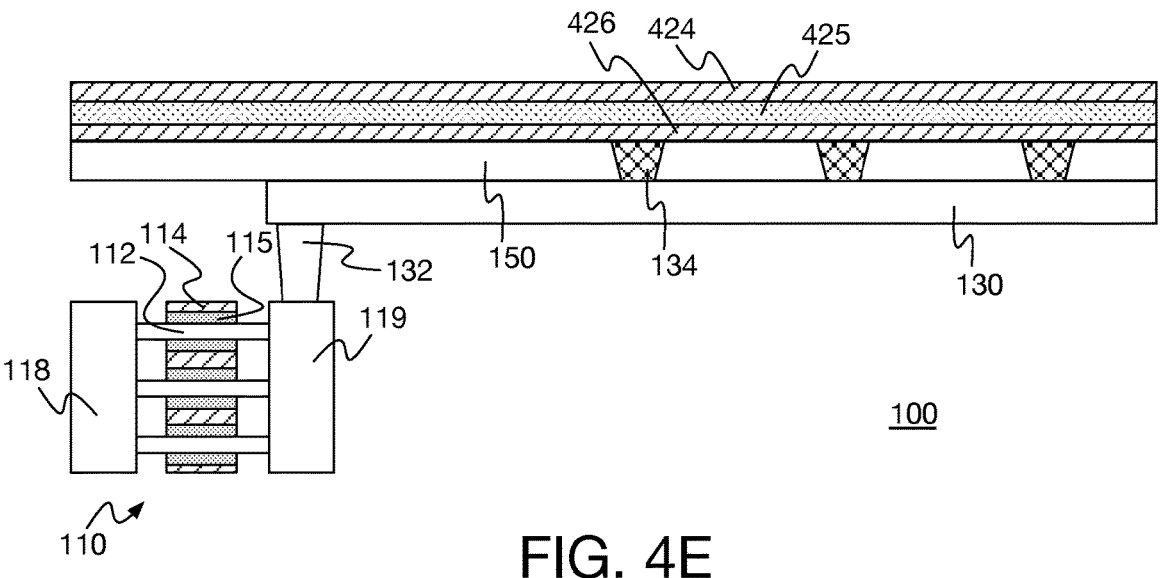
FIG. 4E
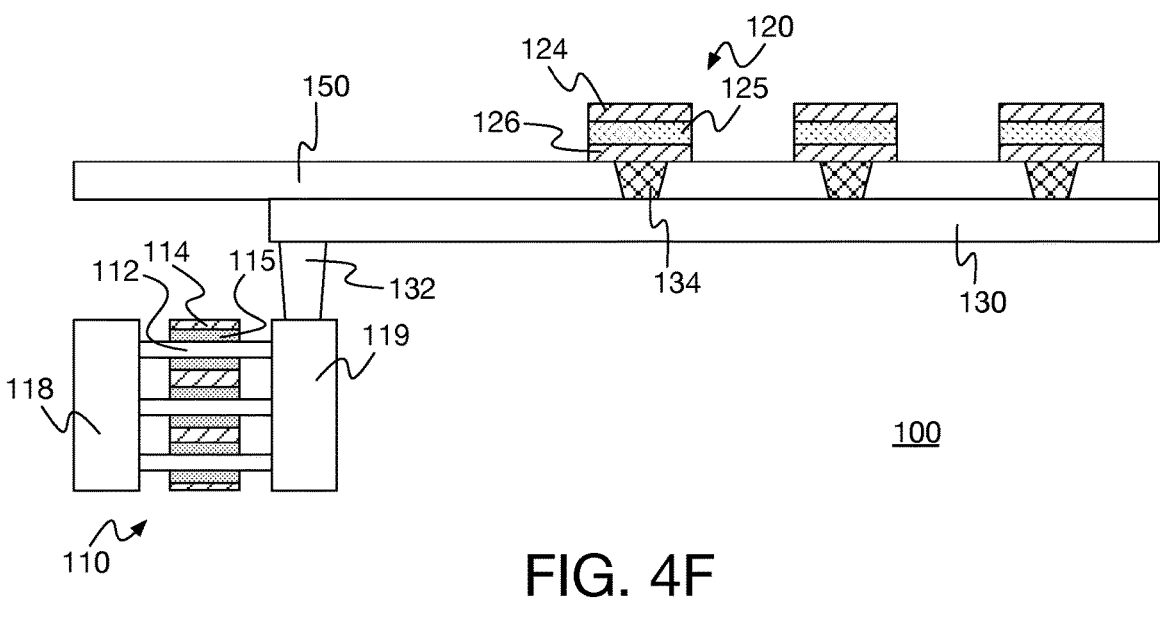
FIG. 4F
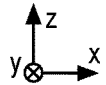

500

689
688
602
616
678
677
M12
679
653
652
M11
M10
654
M9
604
M8
M7
M6
M5
M4/V3
M3/V2
M2/V1
M1
V0
M0
140
C1
C0
101
120
614
650
613
130  110
112
644
BM0
BM1
651
654
605
BM2
MIM
653
BM3
655
606
Bump

555

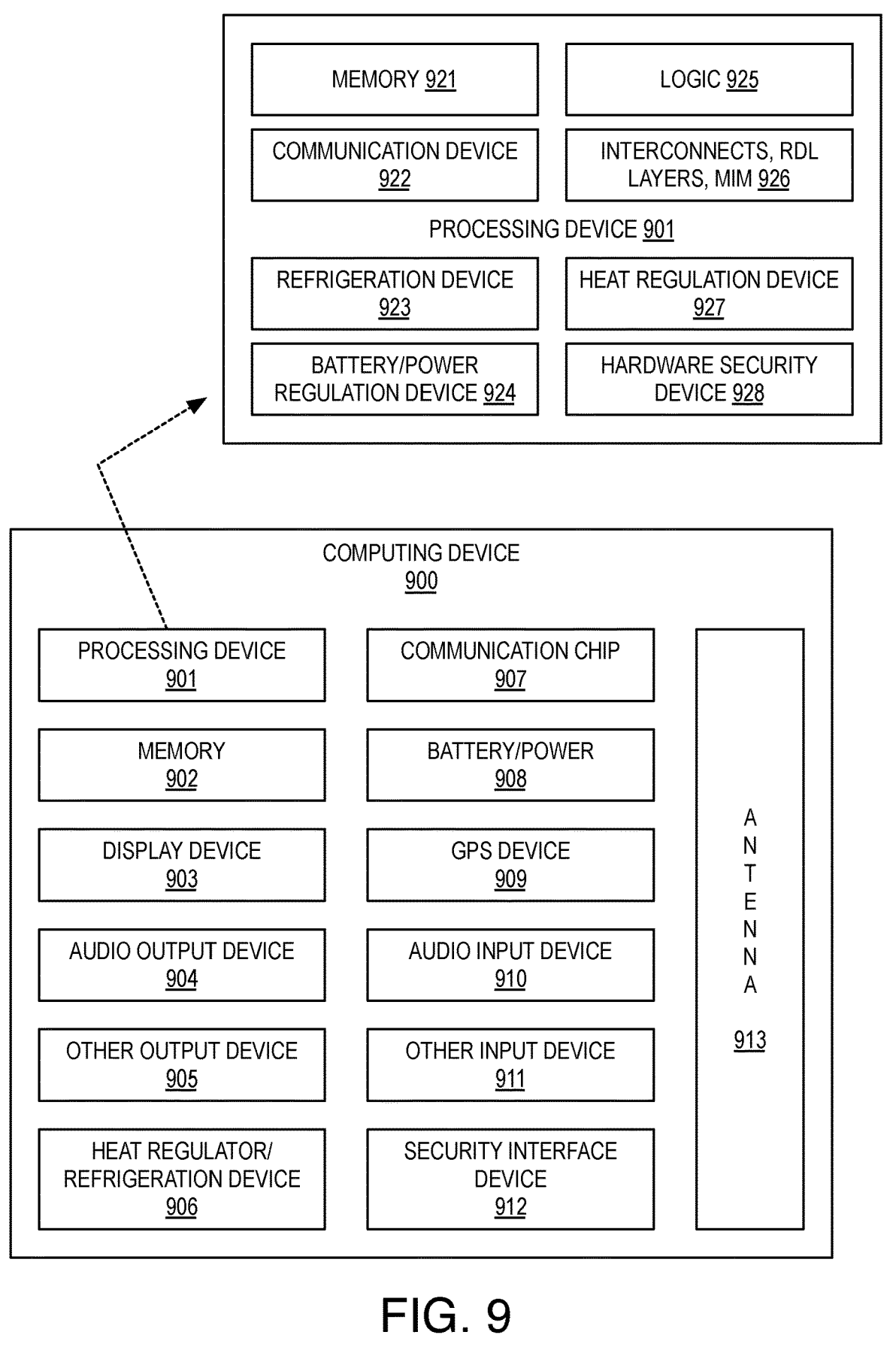

| MEMORY 921 | LOGIC 925 |
|---|---|
| COMMUNICATION DEVICE 922 | INTERCONNECTS, RDL LAYERS, MIM 926 |

PROCESSING DEVICE 901

| REFRIGERATION DEVICE 923 | HEAT REGULATION DEVICE 927 |
|---|---|
| BATTERY/POWER REGULATION DEVICE 924 | HARDWARE SECURITY DEVICE 928 |

COMPUTING DEVICE
900

| PROCESSING DEVICE 901 | COMMUNICATION CHIP 907 | |
|---|---|---|
| MEMORY 902 | BATTERY/POWER 908 | |
| DISPLAY DEVICE 903 | GPS DEVICE 909 | A N T E N N A 913 |
| AUDIO OUTPUT DEVICE 904 | AUDIO INPUT DEVICE 910 | |
| OTHER OUTPUT DEVICE 905 | OTHER INPUT DEVICE 911 | |
| HEAT REGULATOR/ REFRIGERATION DEVICE 906 | SECURITY INTERFACE DEVICE 912 | |

FIG. 9

MULTI-STORAGE ELEMENT SINGLE-TRANSISTOR CROSSPOINT MEMORY SYSTEMS AT LOW TEMPERATURES

BACKGROUND

Memory performance and cost pressures drive a continuous and ever-increasing demand for denser, cheaper, more stable, and less volatile memory devices. Density improvements in random-access memory (RAM), including crosspoint memory, devices could readily improve and enable larger and more complex devices. For example, system performance can be improved by using denser resistive RAM, ferroelectric RAM, magnetoresistance RAM, phase-change RAM, etc., in place of other less-dense or more-volatile memory devices. More complex systems can be made better or less expensive with denser and cheaper crosspoint memory devices.

Structures and methods are needed to improve crosspoint memory devices and the larger systems in which the crosspoint memory devices are deployed. It is with respect to these and other considerations that the present improvements have been needed. Such improvements may become critical as the desire to improve memory become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 4A, 4B, 4C, 4D, 4E, 4F, and 4G illustrate cross-sectional profile views of a memory device, including an array of storage elements coupled to a single access transistor, at various stages of manufacture;

FIG. 9 is a block diagram of an example computing device, all in accordance with some embodiments.

DETAILED DESCRIPTION

Figure 1:
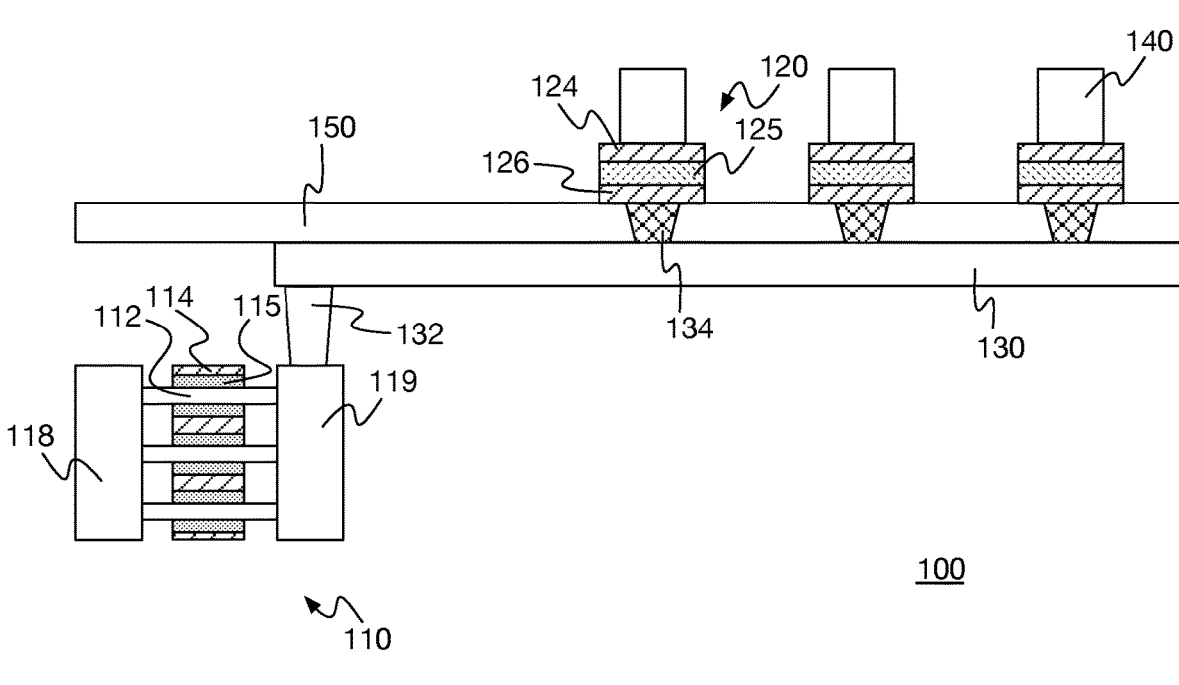
FIG. 1 illustrates a cross-sectional profile view of a memory device, including an array of storage elements coupled to a single access transistor.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up, i.e. scaling down, or scaling up, respectively) of a signal frequency relative to another parameter, for example, power supply level.

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the density of random-access memory (RAM) devices, e.g., crosspoint memory devices. Many RAM devices store data in a storage material between two conductive plates. For example, ferroelectric RAM (FeRAM) devices may store data in ferroelectric capacitors. Charge-trap memory may use, e.g., oxide and nitride layers between two conductive plates. Resistive RAM (ReRAM), magnetoresistive RAM (MRAM), phase-change memory (PCM) (or phase-change RAM (PRAM)), and other types of memory devices can be used. RAM density can be increased by storing more bits per access transistor, e.g., by connecting multiple storage elements to a single transistor. Further scaling can be achieved by decreasing component sizes and storage line pitches. Small access transistors with narrow channels, e.g., within fins, nanowires, nanoribbons, or nanosheets can be laid out with small pitches along crosspoint grid edges. Without internal access transistors, crosspoint grid grids can be tightened, i.e., storage element and line pitches can be reduced. Advantageously, system temperatures can be reduced to, e.g., increase conductances, reduce leakage currents, and relieve disturb issues (e.g., related to necessary voltage levels), thereby enabling smaller component sizes.

FIG. 1 illustrates a cross-sectional profile view of a memory device 101, including an array of storage elements 120 coupled to a single access transistor 110, in accordance with some embodiments. Memory device 101 is within an integrated circuit (IC) die 100 and includes transistor 110, which is an access or select transistor, for accessing the bits stored in the group of storage elements 120. Select transistor 110 is coupled to each of storage elements 120 by a storage line 130. Storage elements 120 are coupled to source lines 140, which are each on an end of a corresponding storage element 120 electrically opposite storage line 130. Storage elements 120 may be in a layer above the layer comprising transistor 110, and an etch-stop layer 150 may separate the two layers.

Storage elements 120 each include an upper electrode 124, a lower electrode 126, and a storage layer 125 between them. Storage elements 120 are coupled and electrically connected to source lines 140 at upper electrodes 124. Storage elements 120 are coupled and electrically connected to storage line 130 at lower electrodes 126. Information, e.g., a bit or bits, is stored in each storage element 120 by the delivery of certain voltages in certain sequences to upper and lower electrodes 124, 126 by source lines 140 and storage line 130, respectively. Upper and lower electrodes 124, 126 may include multiple layers, e.g., of different materials. For example, one or more layers may act as interface layers for interfacing with adjacent structures, e.g., storage layer 125.

Storage layer 125 may employ one or more of multiple memory technologies and may also include one or multiple layers, e.g., sublayers, with different compositions or functions. For example, memory device 101 may be part of, e.g., an FeRAM system, an MRAM system, or another crosspoint memory system. In some embodiments, storage layer 125 consists of a single layer of material. For example, in some embodiments, memory device 101 is part of an FeRAM system, and storage elements 120 are ferroelectric capacitors with storage layer 125 consisting of a single layer of a ferroelectric material to store a bit of information as a positive or negative polarization of the ferroelectric material storage layer 125.

In other embodiments, storage layer 125 comprises multiple layers of materials with differing compositions. As an example, in some embodiments, memory device 101 is part of charge-trap memory system, and one or more bits of information are stored as charge within the multiple layers of storage layer 125. In some such embodiments, storage layer 125 includes multiple insulator layers between upper and lower electrodes 124, 126. In some such embodiments, storage layer 125 includes, e.g., a nitride layer between two oxide layers (oxide-nitride-oxide), all between upper and lower electrodes 124, 126. In some such embodiments, storage layer 125 includes silicon nitride ($Si_3N_4$ or $Si_9N_{10}$). As another example, in some embodiments, memory device 101 is part of an MRAM system, and a bit of information is stored as a higher or lower resistant state of storage layer 125 based on the relative magnetic alignments of multiple layers of storage layer 125. In some such embodiments, storage layer 125 includes two ferromagnetic layers, an intervening non-magnetic layer between them, and an antiferromagnetic layer. In some such embodiments, the intervening non-magnetic layer is a metal or metal oxide. In other such embodiments, the intervening non-magnetic layer is a dielectric. Some technologies and materials will be discussed further below.

Access transistor 110 includes a gate electrode 114, gate dielectric 115, and channel 112 between a source (and source contact 119) and a drain (and drain contact 118). Channel 112 extends the length of gate electrode 114. As used herein, the term channel indicates a structure that may be activated during operation. The channel may be characterized as a channel structure, semiconductor material structure, or the like.

Source contact 119 and drain contact 118 connect to either end of transistor 110. Source contact 119 connects to the source end of channel 112, and drain contact 118 connects to the drain end of channel 112. In some embodiments, access transistor 110 is structurally and electrically symmetric, e.g., currents will flow in both directions approximately equally, and the source and drain ends of channel 112 are interchangeable. Although a source or drain terminal or contact may be specified in some instances, such usage is not limiting in the context of this description. Either terminal can be used in place of the other in the provided examples.

Select/access transistor 110 can be of any suitable type. Transistor 110 may be a field-effect transistor (FET), e.g., a metal-oxide-semiconductor (MOS) FET, or other transistor. In some embodiments, transistor 110 is a planar transistor. Advantageously, transistor 110 is sufficiently conductive while not occupying overly much lateral area. In some embodiments, transistor 110 is a non-planar transistor, such as a FinFET, where channel 112 is within a substantially vertical fin, a relatively thin semiconductor structure under gate dielectric 115 and gate electrode 114. In some embodiments, as in the example of FIG. 1, access transistor 110 is a non-planar transistor, and channel 112 is within a nanowire or nanosheet with gate dielectric 115 and gate electrode 114 vertically around the nanowire or nanosheet, including channel 112. Such non-planar transistors provide increased conductance relative to at least some other types and can be formed with very small dimensions, e.g., channel thicknesses. In some embodiments, transistor 110 is a non-planar transistor, and channel 112 has channel thickness of not more than 2 nm.

Suitable materials with sufficient conductivity can be used, and system conditions can be manipulated to enhance transistor conductance. In some embodiments, memory device 101 and IC die 100 are coupled to a power supply through a substrate as part of an IC system, and the IC system includes a cooling structure capable of removing, and configured to remove, heat from IC die 100 to lower the operating temperature to below 0° C. In some such embodiments, the cooling structure is operable to remove heat from IC die 100 to achieve an operating temperature of 77K. In some embodiments, memory device 101 and IC die 100 are coupled to a power supply through a substrate as part of an IC system, and the IC system is thermally coupled to a cooling structure capable of removing, and configured to remove, heat from IC die 100 to lower the operating temperature to below 0° C. In some such embodiments, the cooling structure is operable to remove heat from IC die 100 to achieve an operating temperature of 77K. Low temperature operation may allow for improved performance, such as improved mobility and reduced leakage, or for very small dimensions, e.g., of storage elements 120 or thicknesses of channel 112. Such enhanced performance, e.g., conduction, can enable the use of different structures, such as thinner transistor channels 112. In some embodiments, channels 112 of access transistors 110 as described (e.g., in fins, nanosheets, nanoribbons, or nanowires) have a thickness of 2 nm. In some embodiments, channels 112 as described have a thickness of 1 nm.

Reduced dimensions of storage elements 120 may enable reduced current demands for, e.g., polarizing a ferroelectric material or reorienting a magnetization in storage layer 125. Some storage materials have reduced disturb issues at the lower energy levels corresponding to lower temperatures. Such enhanced performance can enable the use of, e.g., different structures, such as smaller storage elements 120. Lower temperatures and reduced disturb issues may enable smaller element-to-element pitches. In some embodiments, the group of storage elements 120 in memory device 101 has an element-to-element pitch of 100 nm. Yet lower temperatures can further enhance conditions and allow for yet smaller dimensions. In some embodiments, the group of storage elements 120 in memory device 101 has an element-to-element pitch of 15 nm.

Gate dielectric 115 is an insulator between gate electrode 114 and channel 112 such that the gate structure is in contact with channel 112, but the control signal on gate electrode 114 is not electrically connected through to channel 112. With gate dielectric 115 as part of the gate structure, an electric field with strength proportional to the control voltage on gate electrode 114 modulates conduction through channel 112. Gate dielectric 115 may have multiple layers. The one or more layers of gate dielectric 115 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 115 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate electrode 114 can be of any material suitable for controlling current through channel 112, e.g., a metal for establishing the gate field. Gate electrode 114 may include one layer or a stack of layers. Gate electrode 114 is on gate dielectric 115 and may include of at least one of a p-type work function metal or an n-type work function metal, depending on whether the transistor is, e.g., a p-type MOS (PMOS) or an n-type MOS (NMOS) transistor. In some embodiments, gate electrode 114 is a stack of two or more metal layers, where one or more metal layers are work function metal layers and at least one metal layer is a fill metal layer. In some embodiments, gate electrode 114 includes titanium, tantalum, or tungsten. In some such embodiments, gate electrode 114 also includes nitrogen. Other materials may be used.

Select or access transistor 110 controls the access to the memory array by electrically connecting (or not) storage line 130 (and storage elements 120 coupled to storage line 130) to, e.g., a bitline connected to the opposite end of transistor 110 at drain contact 118. When access transistor 110 conducts, storage line 130 on source contact 119 is electrically connected to drain contact 118 and, e.g., a bitline, and the bitline is given access to the bits stored in storage elements 120. The conduction of transistor 110 is controlled by the voltage signal applied to gate electrode 114, e.g., by a wordline. A wordline selects the bits stored in storage elements 120 by causing select transistor 110 to conduct. Since storage line 130 is a shared connection for all storage elements 120 in the group, any bit stored in any of the group's storage elements 120 is accessible by the single access transistor 110.

Storage line 130 extends in the x direction and couples transistor 110 to each of storage elements 120. Specifically, storage line 130 couples to each of lower electrodes 126. Storage line 130 may couple to or include transistor via 132 and multiple storage-element vias 134. In the example of FIG. 1, storage line 130 is coupled to transistor 110 at source contact 119 by transistor via 132. In the example of FIG. 1, storage line 130 is coupled to each of storage elements 120 by storage-element vias 134. Storage line 130 is part of an electrical connection between lower electrodes 126 of storage elements 120 and transistor 110, as well as the structure on the electrically opposite end of transistor 110, coupled to drain contact 118, e.g., a bitline.

Source lines 140 extends in the y direction (orthogonal to the x direction of storage line 130) and couples to each of storage elements 120. Specifically, source lines 140 couples to each of upper electrodes 124. Source lines 140 may electrically connect upper electrodes 124 of storage elements 120 to, e.g., other memory devices, other storage elements 120 coupled to another storage line 130, or circuits that control voltages applied to upper electrodes 124 to write bits to storage elements 120.

The operation of storage elements 120, e.g., the voltage levels and signal durations required, varies with storage layer 125, e.g., memory technology and storage material used. As discussed, storage layer 125 may include one or multiple layers, e.g., sublayers, with different compositions or functions. Again, scaling of storage elements 120 and their arrays can be enhanced by materials choices and, e.g., reducing system operating temperatures.

In some embodiments, memory device 101 is a ReRAM device, a non-volatile memory device that utilizes resistance switching to store information. As is known in the art, such a nonvolatile memory device functions as a variable resistor where the resistance of the device may switch between a high-resistance state and a low-resistance state. For example, a normally insulating material can be made more conductive through a filament or other conduction path formed by, e.g., application of a sufficiently high voltage. The conduction path can be formed by any suitable means, including vacancy or metal defect migration. Once the conduction path is formed, it may be reset (broken, resulting in high resistance) or set (re-formed, resulting in lower resistance) by another voltage. Many current paths, rather than a single filament, may be involved. The low-resistance path or paths can be homogeneous, and need not be localized (e.g., filamentary). Both effects can occur either throughout the entire distance between the electrodes or only in proximity to one of the electrodes. Individual storage elements 120 do not each have individual select transistors and, in some embodiments, storage layers 125 may include an isolation or selector layer.

In the examples shown in FIG. 1 and below, storage layer 125 may include an oxygen exchange layer over a switching layer. In some embodiments, a second (or more) switching layer may be used, e.g., to tune a forming voltage of a ReRAM device or to act as an oxygen diffusion barrier preventing a diffusion of oxygen from a first switching layer towards the oxygen exchange layer. Minimizing oxygen diffusion from the first switching layer may influence oxygen vacancy formation and movement during, e.g., a filament forming process. In some embodiments, a switching layer may be a metal oxide, e.g., including oxygen and atoms of one or more metals, such as but not limited to aluminum, hafnium, tantalum, titanium, tungsten, or zirconium. In some embodiments, storage layer 125 includes zirconium (e.g., $Sri_{1-x}Zr_xTiO_3$ or $Sr(Zr)TiO_3$). In the case of titanium or hafnium, or tantalum with an oxidation state +4, switching layer has a chemical composition, $MO_x$, where 'M' is a metal, O is oxygen, and X is or is substantially close to 2. In the case of tantalum with an oxidation state +5, switching layer has a chemical composition, $M_2O_x$, where X is (or is substantially close to) 5. Oxygen exchange layer acts as a source of oxygen vacancy or as a sink for $O_2$. In some embodiments, oxygen exchange layer comprises a metal, such as but not limited to hafnium, tantalum, or titanium. In some embodiments, storage layer 125 includes aluminum (e.g., $Al_2O_3$, etc.). In some embodiments, storage layer 125 includes hafnium (e.g., Hf, $HfO_2$, and other $HfO_x$ compositions). In some embodiments, storage layer 125 includes tantalum (e.g., $Ta_2O_5$, $TaO_x$, etc.). In some embodiments, storage layer 125 includes titanium (e.g., $TiO_x$, etc.). ReRAM memory devices 101 need not employ oxygen exchange and switching layers. One or more other layers may be used. In some embodiments, storage layer 125 includes ZrTe. In some such embodiments, storage layer 125 also includes $Al_2O_3$.

In some embodiments, materials used in upper or lower electrode 124, 126 complement the composition of storage layer 125. For example, if storage layer 125 includes titanium (e.g., $TiO_x$), upper or lower electrode 124, 126 may include a thin layer of titanium adjacent storage layer 125 and then a layer of titanium nitride (or tungsten). If storage layer 125 includes tantalum (e.g., $TaO_x$), upper or lower electrode 124, 126 may include a thin layer of tantalum adjacent storage layer 125 and then a layer of tantalum nitride (or tungsten). In some embodiments, upper or lower electrode 124, 126 is composed of ruthenium layers interleaved with tantalum layers. In some embodiments, upper or lower electrode 124, 126 includes an amorphous conductive layer. In some embodiments, upper or lower electrode 124, 126 is a topographically smooth electrode.

In some embodiments, memory device 101 is a MRAM device, a non-volatile memory device that stores data in magnetic domains. As is known in the art, such a nonvolatile memory device functions as a variable resistor where the electrical resistance of the device may switch between a high-resistance state and a low-resistance state. The electrical resistance state is determined by tunnel magnetoresistance, the relative orientation of the magnetization in at least two magnetic layers. For example, if the two layers have the same magnetization alignment (a low-resistance state), this may be considered a logical 1. If the alignment is antiparallel, this higher-resistance state may be considered a logical 0. The magnetic layers may be two ferromagnetic layers, each of which can hold a magnetization, separated by a thin insulating layer (in a tunneling junction) or non-magnetic metal or metal oxide (in a spin valve). For example, one of the two layers may be ferromagnetic and set to a particular polarity (e.g., "pinned" by a vertically adjacent anti-ferromagnetic layer). The other layer's magnetization may be free (rather than "pinned") to match that of an external field to store memory. In some such embodiments, storage layer 125 includes two ferromagnetic layers. In some embodiments, storage layer 125 includes a tunneling junction layer. In some embodiments, storage layer 125 includes a spin valve layer. In some embodiments, memory device 101 is a spin-transfer torque (STT) MRAM (STT-MRAM) device, and storage elements 120 have lower minimum-current requirements. In some embodiments, storage layer 125 includes an anti-ferromagnetic layer. In some embodiments, storage layer 125 includes a synthetic anti-ferromagnetic (SAF) layer. In some embodiments, storage layer 125 includes portions with different compositions where the portions includes structures that are not solely horizontal layers.

In some embodiments, storage layer 125 includes a ferromagnetic layer formed of CFGG (i.e., cobalt (Co), iron (Fe), germanium (Ge), or gallium (Ga) or a combination of them). In some embodiments, storage layer 125 includes a ferromagnetic layer comprising one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, storage layer 125 includes a ferromagnetic layer with perpendicular magnetic anisotropy (PMA) and materials from a group including Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; materials with L10 symmetry; and materials with tetragonal crystal structure. In some embodiments, the ferromagnetic layer with PMA is formed of a single layer of one or more materials. In some embodiments, the single layer is formed of MnGa.

In some embodiments, storage layer 125 includes a magnetic junction layer. In some such embodiments, when the magnetic junction is a spin valve, storage layer 125 includes a metal or a metal oxide (e.g., a non-magnetic metal such as aluminum and/or its oxide). In other embodiments, when the magnetic junction is a tunneling junction, storage layer 125 includes a tunneling dielectric (e.g. MgO, $Al_2O_3$).

In some embodiments, storage layer 125 includes a spin Hall effect (SHE) layer including one or more of β-tantalum (β-Ta), tantalum, β-tungsten ((3-W), tungsten, platinum, copper doped with elements such as iridium, bismuth, and any of the elements of 3*d*, 4*d*, 5*d* and 4*f*, 5*f* periodic groups in the periodic table which may exhibit high spin orbit coupling. In some embodiments, a SHE layer in storage layer 125 includes high-conductivity, non-magnetic metal(s) to reduce the resistance of SHE layer. The non-magnetic metal(s) include one or more of copper, cobalt, α-tantalum, aluminum, or an alloy of copper or nickel with silicon. In some embodiments, storage layer 125 includes a spin Hall effect (SHE) layer including a spin-orbit, two-dimensional (2D) material. In some such embodiments, storage layer 125 includes one or more of graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiO$-$BiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, storage layer 125 includes a spin Hall effect (SHE) layer including a spin-orbit, Rashba-Bychkov material. In some such embodiments, storage layer 125 includes materials $ROCh_2$, where 'R' includes one or more of La, Ce, Pr, Nd, Sr, Sc, Ga, Al, or In, and where "Ch" is a chalcogenide which includes one or more of S, Se, or Te.

In some embodiments, storage layer 125 includes an anti-ferromagnetic layer. In some such embodiments, storage layer 125 is doped with and includes oxygen, nitrogen or heavy metal with large spin-flip length and small thermal mobility such as Ta, Pt, W, Mo, Co, Ni and others. In other such embodiments, storage layer 125 is doped with and includes Co, Fe, Ni, MnGa, or MnGeGa. In some embodiments, storage layer 125 is doped with and includes IrMn, PtMn, NiMn or other triangular, Kagomi, chiral or hexagonal anti-ferromagnetic material and in their single crystal form or their amorphous alloys in various compositions. In some embodiments, storage layer 125 includes Jr, Pt, Mn, Pd, or Fe. In some embodiments, storage layer 125 includes a quasi-2D triangular anti-ferromagnetic material including $Ni_{1-x}M_xGa_2S_4$, where 'M' includes one of Mn, Fe, Co or Zn.

In some embodiments, memory device 101 is a PCM device, a non-volatile memory device that utilizes resistance switching to store information. As is known in the art, such a nonvolatile memory device functions as a variable resistor where the resistance of the device may switch between a high-resistance state and a low-resistance state. The electrical resistance state is determined by the phase state of the storage material, e.g., whether it is crystalline or amorphous. For example, the crystalline and amorphous states of chalcogenide glass have dramatically different electrical resistivity values. The amorphous, high-resistance state can represent a logical or binary 0, while the crystalline, low-resistance state can represent a logical 1. In PCM devices, heat produced by the passage of an electric current through a heating element, e.g., made of titanium nitride, is used to either quickly heat the glass and then quench it, making it amorphous, or to hold it in its crystallization temperature range for some time, thereby switching it to a crystalline state. PCM storage elements 120 may also store a number of distinct intermediary states, thereby having the ability to hold more than two binary bits in a single cell.

In the examples shown in FIG. 1 and below, the crosspoint memory array may employ PCM storage elements 120, and storage layers 125 may include phase-change storage materials, such as chalcogenide glass. Chalcogenide glass contains one or more chalcogens (the Group 16 elements sulfur, selenium and tellurium, but excluding oxygen). In some embodiments, storage layer 125 includes germanium and tellurium (e.g., GeTe). In some such embodiments, storage layer 125 includes germanium and tellurium doped with 5% tin (e.g., GeTe with 5% Sn). In some embodiments, storage layer 125 includes silicon, tellurium, arsenic, and germanium (e.g., $Te_{48}As_{30}Si_{12}Ge_{10}$). In some embodiments, storage layer 125 includes germanium, antimony (Sb), and tellurium (GST) (e.g., $Ge_2Sb_2Te_5$, or in a GeTe—$Sb_2Te_3$ superlattice). In some embodiments, storage layer 125 includes silver, indium, antimony, and tellurium (e.g., AgInSbTe). In some cases, selenium may replace germanium. In some embodiments, storage layer 125 includes InSe, SbSe, SbTe, InSbSe, InSbTe, GeSbSe, GeSbTeSe or AgInSbSeTe. In some embodiments, storage layer 125 includes sulfur (e.g., AsS, GeS, or gallium lanthanum sulfide (e.g., Ga—La—S glass)).

PCM storage elements 120 need not include chalcogenides. In some embodiments, storage layer 125 includes aluminum and antimony (e.g., $Al_{50}Sb_{50}$). Other materials may be used.

In some embodiments, the crosspoint memory array employs FeRAM storage elements 120. In the examples shown in FIG. 1 and below, storage elements 120 may be ferroelectric capacitors, and storage layers 125 may include a ferroelectric material with a high relative permittivity. A ferroelectric capacitor with a higher relative permittivity can have smaller plate dimensions for the same capacitance value. A ferroelectric capacitor with smaller plate dimensions can have the same capacitance value by proportionally decreasing the distance between the capacitor plates. For example, hafnium oxide in a ferroelectric phase may have a relative permittivity exceeding 25 (e.g., 30). In the case of hafnium oxide, ferroelectric phases may be achieved, for example, through the addition of a dopant, such as niobium, titanium, silicon, germanium, aluminum, yttrium, etc.

Many ferroelectric materials are suitable for use in storage layer 125. As used herein, the term ferroelectric material indicates a material that has a spontaneous electric polarization that may be controlled by the application of an external electric field. Ferroelectric materials exhibit a hysteresis such that when a positive voltage is applied, a positive residual charge is maintained even as the voltage falls to zero. This residual charge is characterized as polarization. To remove the polarization, a negative voltage must be applied. Furthermore, the negative voltage may be used to provide a negative polarization, which is also maintained as the voltage again goes to zero. In storage elements 120 and other ferroelectric capacitor structures discussed herein, a differential voltage must be applied across a ferroelectric capacitor to polarize storage layer 125 (i.e., the ferroelectric material) either positively or negatively. This positive or negative polarity may then be read as a logical 1 or 0. Besides the advantage of higher relative permittivity, ferroelectric materials and this polarization have this non-volatility advantage over non-ferroelectric dielectric materials.

Storage layer 125 may include a ferroelectric material that may be deposited to very narrow thicknesses. Such is the case with numerous oxides of hafnium or similar metals. In some embodiments, storage layer 125 includes hafnium, zirconium, and oxygen ($H_2O$) (e.g., hafnium zirconium oxide, $Hf_{1-x}Zr_xO_2$). In some such embodiments, storage layer 125 includes dopants, e.g., titanium or niobium. In some embodiments, storage layer 125 includes hafnium, titanium, and oxygen (e.g., hafnium titanium oxide, $Hf_{1-x}Ti_xO_2$). In some embodiments, storage layer 125 includes hafnium, scandium, and oxygen. In some embodiments, storage layer 125 includes zirconium and oxygen (e.g., zirconium dioxide, $ZrO_2$) In some embodiments, storage layer 125 includes niobium and oxygen. Although, e.g., hafnium zirconium oxide or doped $HfO_x$ are exemplary embodiments that can be deposited by atomic layer deposition (ALD), storage layer 125 may also have other compositions similarly amenable to being deposited at temperatures compatible with, e.g., back-end-of-line (BEOL) structures and with similar thickness. The use of 2D ferroelectric materials allows for arrays with smaller capacitors and increased memory density.

Advantageously, storage layer 125 can be simply and quickly deposited in a plane, e.g., by chemical or physical vapor deposition (CVD or PVD), to a necessary thickness. For example, a blanket layer of ferroelectric material can be deposited at once for an entire array of storage elements 120, and individual storage layers 125 can be formed, e.g., etched, from the layer. In some embodiments, storage layer 125 includes lead, zirconium, titanium, and oxygen (e.g., lead zirconium titanate, $Pb[Zr_xTi_{1-x}]O_3$, (PZT)). PZT and materials like it may be ultra-scalable and ultra-low voltage. In some embodiments, storage layer 125 includes barium, titanium, and oxygen (e.g., barium titanate, $BaTiO_3$). In some embodiments, storage layer 125 includes lead, titanium, and oxygen (e.g., lead titanate, $PbTiO_3$). In some embodiments, storage layer 125 includes barium, strontium, titanium, and oxygen (e.g., barium strontium titanate, $BaSrTiO_3$). Other ferroelectric materials may be employed.

As with transistor conductance, ferroelectric capacitor performance can be enhanced by manipulating system operating conditions. Active cooling structures can lower operating temperatures, which can, e.g., lower charge leakage and better store data without excessive disturb issues. Smaller dimensions and voltages may be used.

Figure 2:
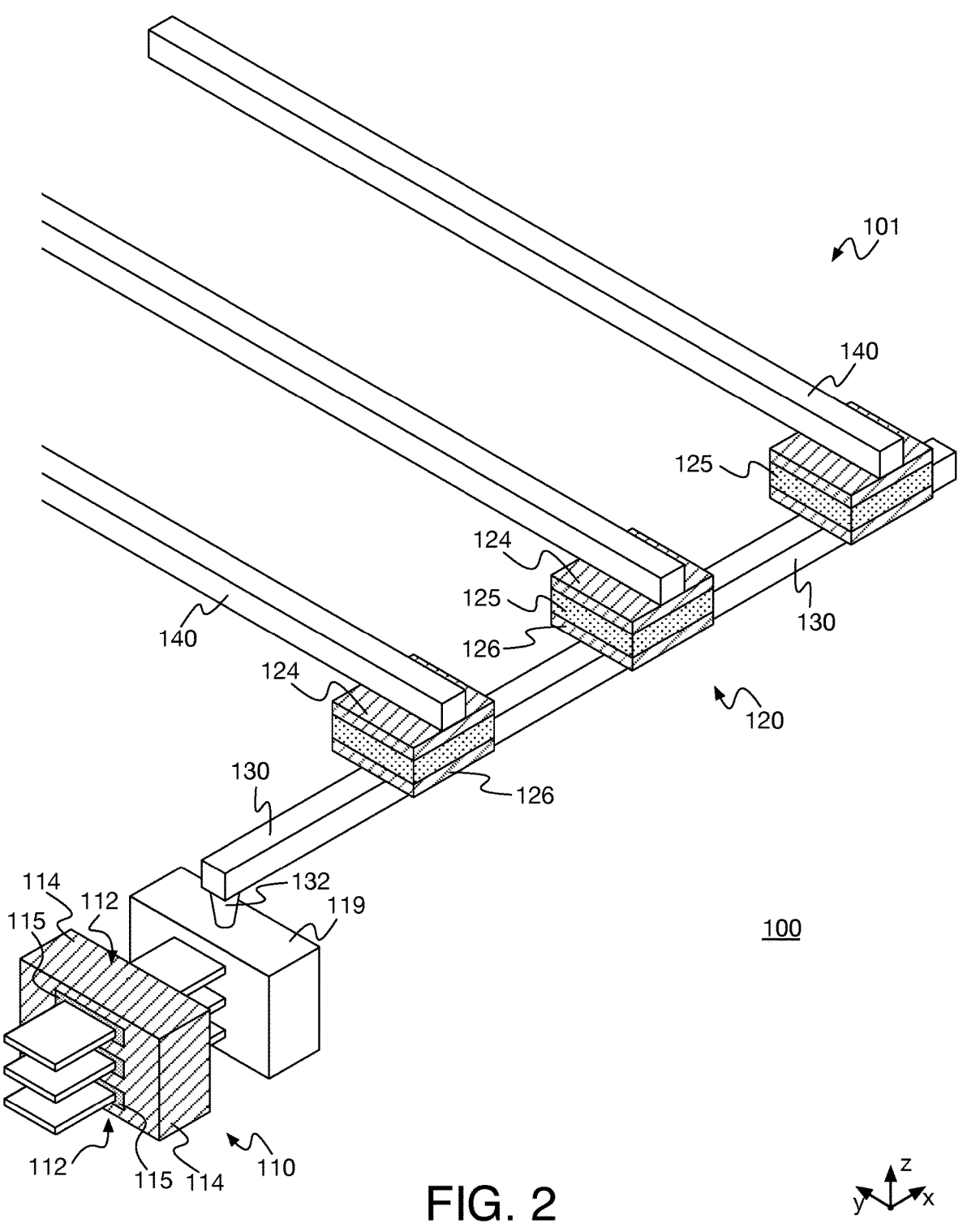
FIG. 2 illustrates an isometric view of a memory device, including an array of storage elements coupled to a single access transistor.

FIG. 2 illustrates an isometric view of memory device 101, including an array of storage elements 120 coupled to a single access transistor 110, in accordance with some embodiments. FIG. 2 shows the same or similar IC die 100 and memory device 101 from a different angle. This figure does not show, or this embodiment does not employ, etch-stop layer 150, so transistor 110 can be seen from above and the side. Storage-element vias 134 are not employed in this embodiment or are obscured by storage elements 120 above them. Transistor via 132 can still be seen extending up from the top of source contact 119 to storage line 130.

Rather than extending orthogonally into the viewing plane, the group of source lines 140 are seen from above and the side, extending in the y direction, orthogonal to the x direction that storage line 130 extends in Storage line 130 and source lines 140 couple to storage elements 120. Each source line 140 couples to a corresponding storage element 120 at its upper electrode 124. Storage line 130 couples to storage elements 120 at their lower electrodes 126.

Drain contact 118, where a bitline might connect to transistor 110, is not shown, and so transistor 110 is revealed from above and the side. Gate dielectric 115 can be seen wrapped around and coupled to the nanosheet comprising channel 112. Channel 112 runs the length of gate electrode 114, but is obscured by gate dielectric 115 and gate electrode 114. In this way, gate dielectric 115 insulates channel 112 from gate electrode 114.

Figure 3:
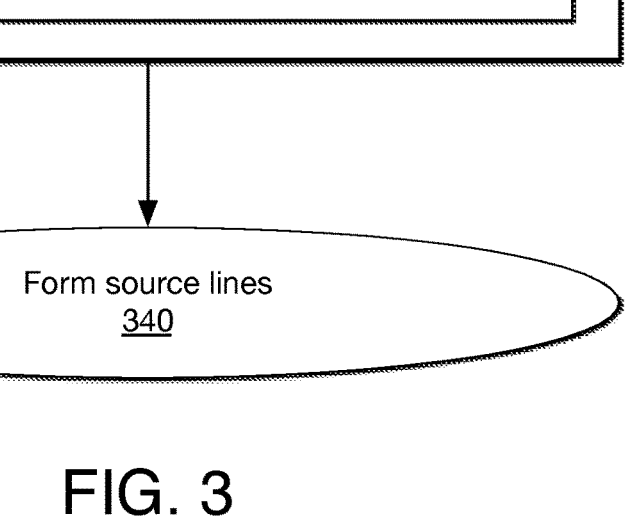
FIG. 3 illustrates various processes or methods for forming a memory device having an array of storage elements coupled to a single access transistor.

FIG. 3 illustrates various processes or methods for forming a memory device having an array of storage elements coupled to a single access transistor, in accordance with some embodiments. FIG. 3 shows methods 300 that includes operations 310-340. Some operations shown in FIG. 3 are optional. FIG. 3 shows an example sequence, but the operations can be done in other sequences as well, and some operations may be omitted. Some operations can also be performed multiple times before other operations are performed. Some operations may be included within other operations. Some operations may overlap with other operations. Methods 300 generally entail forming groups of storage elements sharing an access transistor and at the intersections of source lines and one or more storage lines.

FIGS. 4A, 4B, 4C, 4D, 4E, 4F, and 4G illustrate cross-sectional profile views of memory device 101, including an array of storage elements 120 coupled to a single access transistor 110, at various stages of manufacture, in accordance with some embodiments. As shown in FIGS. 4A-4G, storage line 130 is formed on received IC die 100 and coupled to received transistor 110. Storage elements 120 are formed coupled to storage line 130. Source lines 140 are formed coupled to storage elements 120. Storage elements 120 may be formed by forming upper electrode, storage, and lower electrode layers and removing portions of those layers.

Returning to FIG. 3, a substrate with a transistor is received in operation 310 for forming an array of storage elements. The substrate is a planar platform and may be part of an IC die already including dielectric and metallization structures and a transistor. In some embodiments, the transistor is a non-planar transistor, e.g., with a channel within a nanowire or nanosheet, or a FinFET with a channel within a substantially vertical fin. The substrate may be one of many layers in an IC die, and may itself have many layers. The substrate may be above other layers in the IC die (all or of a portion of which may be subsequently removed in back-side metallization contexts), and other layers may subsequently be formed in or over the substrate.

The substrate may include any suitable material or materials. Any suitable semiconductor or other material can be used. A transistor may be of the same material as the substrate or, e.g., deposited on the substrate. The substrate may include a semiconductor material that transistors can be formed out of and on, including a crystalline material. In some examples, the substrate may include monocrystalline silicon (Si), germanium (Ge), silicon germanium (SiGe), a III-V alloy material (e.g., gallium arsenide (GaAs)), a silicon carbide (SiC), a sapphire ($Al_2O_3$), or any combination thereof. In some embodiments, the substrate includes crystalline silicon and subsequent components are also silicon.

In operation 320, a storage line is formed and coupled to the source or drain of the transistor. The storage line may be formed in separate stages, e.g., in portions corresponding to different orientations (e.g., vertical or horizontal) or different layers in or over the substrate. The storage line is to be a shared connection for the first electrodes (e.g., lower electrodes) of the group of storage elements. The storage line should conduct sufficiently to, e.g., deliver sufficient current to the first electrodes of the storage elements or, e.g., polarize ferroelectric material used in a storage layer. For example, the storage line may be formed of a metal convenient to and compatible with a standard manufacturing process, e.g., copper. Any suitable methods may be used, including conventional methods such as damascene and dual-damascene processes, to form metallization structures in IC dies. Horizontal portions may be formed before, concurrently with, or after vertical portions. As the storage line is to be coupled to the source or drain of the transistor, the storage line may be formed concurrently, and even integrally, with the source or drain contact of the transistor. For example, the storage line can be formed horizontally, e.g., contacting a source or drain contact of the transistor and extending in the x direction.

In other embodiments, the storage line can be formed horizontally, e.g., extending in the x direction, coupled to a vertical metallization structure, e.g., a via connection, that includes a source or drain contact that directly contacts the source or drain end of the transistor and its channel. A vertical hole can be formed in the substrate, e.g., dielectric material, above the source or the drain of the received transistor, and a metallization structure can be formed in the vertical hole such that the metallization structure contacts said source or drain. In some embodiments, the vertical hole is vertically aligned with, e.g., a source contact and the metallization structure is formed with the same material as the source contact to form a single, integrated metallization structure including the source contact and the storage line. In some embodiments, the vertical hole is dry etched, e.g., with a deep reactive ion etch (DRIE). In some such embodiments, the vertical hole is formed through the storage line or a channel material after they have been formed. The connection from the source or drain contact to the storage line need not be vertically oriented. In some embodiments, a metal is used for the storage line that is compatible with, e.g., a storage material used in a storage layer of the storage elements.

FIG. 4A shows IC die 100 as an example received substrate with transistor 110. Storage line 130 has been formed and coupled to transistor 110 at source contact 119, electrically opposite drain contact 118. Storage line 130 is coupled to the source of transistor 110 and channel 112 by source contact 119 and vertical transistor via 132. Storage line 130 extends horizontally in the x direction.

Returning to FIG. 3, a group of storage elements are formed over, and coupled to, the storage line in operation 330. The storage elements are each to be coupled to the storage line and include a layer of storage material between two electrodes, e.g., top and lower electrodes. In some embodiments, the storage elements are formed in a layer distinct from and above the layer that includes the access transistor. In some such embodiments, an etch-stop layer is formed over the storage line, e.g., to facilitate forming the storage elements as layers before etching away portions of the deposited layers. Such an etch-stop layer may be deposited after the layer below, e.g., a dielectric layer, is polished to a substantially planar surface following the forming of metallization structures, such as the source line, in the layer. More metallization structures can be formed through the etch-stop layer, e.g., short via connections, to couple the storage line below to the storage elements to be formed over the etch-stop layer. Another polishing operation can be done to planarize the etch-stop layer before forming the storage elements.

FIG. 4B shows IC die 100 after etch-stop layer 150 and storage-element vias 134 have been formed over storage line 130 and planarized. Storage-element vias 134 will couple storage elements 120 to storage line 130 (and transistor 110) through etch-stop layer 150. The upper surface of etch-stop layer 150 and storage-element vias 134 is prepared for the deposition of further material layers.

Returning to FIG. 3, the forming of the storage elements in operation 330 may include operations 332, 334, 336, and 338. In operation 332, a lower or first electrode layer is formed over the storage line (or the storage line may later be formed from the lower electrode layer). The lower electrode layer is formed contacting electrical connections in the layer below, e.g., the storage lines or storage-element vias. The layer will include all lower electrodes for the entire array in a layer of, e.g., metal. In some embodiments, the layer will include all lower electrodes for the entire array together in a contiguous layer of metal. In some embodiments, the layer will include all lower electrodes for the entire array in a same layer, but separated into patterned shapes, each corresponding to a separate storage element. The forming can be by any suitable means. Advantageously, the entire lower electrode layer can be simply and quickly deposited in a plane, e.g., by CVD or PVD, to a necessary thickness to account for the entire array of storage elements.

In some embodiments, the lower electrode layer includes multiple layers, e.g., sublayers. For example, one or more layers (or sublayers) may act as interface layers with adjacent layers. In some embodiments, a top sublayer within the lower electrode layer is a thin layer of titanium (or tantalum) deposited over a thicker layer of titanium nitride (or tantalum nitride or tungsten) to interface with a storage layer of titanium oxide (or tantalum oxide) above the lower electrode layer. One or more layers may form the bulk of the electrodes due to material characteristics, such as conductivity, or ease of processing (e.g., compatibility with or availability in a manufacturing process). In some embodiments, the lower electrode layer includes copper.

In some embodiments, forming the lower electrode layer is integral with forming the storage lines. In some such embodiments, the lower electrodes are integrated with the storage lines (e.g., without any additional metallization, such as a plate), and the storage lines are, e.g., etched from the lower electrode layer. The storage layer may be formed before or after portions of the lower electrode layer are removed.

FIG. 4C shows IC die 100 after a lower electrode layer 426 has been formed. In the example of FIG. 4C, lower electrode layer 426 is over etch-stop layer 150. Lower electrode layer 426 is in contact with storage-element vias 134. In some embodiments, lower electrode layer 426 is deposited, e.g., by CVD or PVD, and planarized.

In operation 334, a storage layer is formed, e.g., by depositing a storage material, over the lower electrode layer. Such deposition can be by any suitable means. In some embodiments, e.g., MRAM devices, multiple sublayers of the storage layer must be formed over the lower electrode layer. In some embodiments, the storage layer is formed by depositing a single layer of storage material over the entire lower electrode layer. For example, $HfO_2$ may be deposited by atomic layer deposition (ALD). In some embodiments, the storage layer is deposited relatively slowly for fine storage layer thickness control, e.g., to form a thin layer. Advantageously, a storage material may be deposited quickly over a large, planar surface, e.g., the entire lower electrode layer with PVD or CVD as a bulk, blanket layer. The storage layer can then be thinned or planarized as necessary. In some embodiments, a ferroelectric material is deposited over the lower electrode layer, e.g., PZT over a planar surface by CVD. In some embodiments, the storage layer is formed with a ReRAM storage material, including oxygen and at least one of aluminum, hafnium, tantalum, titanium, tungsten, or zirconium (e.g., $Al_2O_3$, $HfO_2$, $Ta_2O_5$, $TiO_x$, or $Sri_{1-x}Zr_xTiO_3$). In some embodiments, the storage layer is formed with an MRAM material, including oxygen and at least one of aluminum or magnesium (e.g., a tunneling dielectric (e.g. $MgO$, $Al_2O_3$)). In some embodiments, the storage layer is formed with an MRAM material, including cobalt, iron, germanium, gallium, copper, manganese, nickel, or palladium (e.g., $Co_2FeGe$, $MnGa$, $Cu_2MnSn$, $Ni_2MnAl$, or $Pd_2MnAl$). In some embodiments, the storage layer is formed with a PCM material, including sulfur, selenium, or tellurium (e.g., germanium and tellurium doped with 5% tin, $Ge_2Sb_2Te_5$, or SbSe, InSbSe, GeSbSe, GeSb-TeSe, or AsS, GeS, or gallium lanthanum sulfide (e.g., Ga—La—S glass)). In some embodiments, the storage layer is formed with a ferroelectric material, including titanium and oxygen and at least one of lead, strontium, or barium (e.g., PZT, barium titanate, lead titanate, or barium strontium titanate).

In some embodiments, e.g., where the lower electrodes are integrated with the storage lines (e.g., without any additional metallization, such as a plate), the storage layer is deposited only where the lower electrodes have been deposited (or, after having deposited a lower electrode layer over a large plane covering the entire array, where the lower electrodes have been etched to). In some embodiments, the storage layer is deposited only on the storage lines where the source lines will overlap the storage elements, the lower electrodes are integrated with the storage lines, and the upper electrodes will be integrated with the source lines.

FIG. 4D shows IC die 100 after a storage layer 425 has been formed over lower electrode layer 426. An entire, contiguous storage layer 425 has been deposited in a plane over an entire, contiguous lower electrode layer 426 and planarized.

In operation 336, an upper electrode layer is formed. Such formation, e.g., deposition, can be by any suitable means, which may be by the same or different method as the lower electrode layer. In some embodiments, upper and lower electrode layers have multiple corresponding layers, but the respective layers are formed in the opposite sequence. For example, one or more layers (or sublayers) may act as interface layers with adjacent layers. In some embodiments, a bottom sublayer within the upper electrode layer is a thin layer of titanium (or tantalum) deposited over a storage layer of titanium oxide (or tantalum oxide) to interface between the storage layer and a thicker layer of titanium nitride (or tantalum nitride or tungsten) above a bottom sublayer within the upper electrode layer. In some embodiments, e.g., ReRAM devices, an upper electrode layer usually includes low-work function, high-oxide-energy-formation material.

FIG. 4E shows IC die 100 after and upper electrode layer 424 has been formed over storage layer 425. The three layers (upper electrode, storage, and lower electrode layers 424, 425, 426) are over each other in a stack and cover the entire area of the array.

In operation 338, portions of the lower electrode layer, storage layer, and upper electrode layer are removed. In some embodiments, the lower electrode, storage layer, and upper electrode are the same shape, e.g., identical rectangles, and the three layers are anisotropically etched with the same patterned hardmask features, e.g., by a DRIE. In some embodiments, the three layers are etched before the source lines are formed over the upper electrodes. In other embodiments, the three layers are etched after the source lines are formed, and the source lines serve as hardmask features for an anisotropic etch.

FIG. 4F shows IC die 100 after extra portions of the lower electrode layer, storage layer, and upper electrode layer have been removed, revealing lower electrode 126, storage layer 125, and upper electrode 124 within storage elements 120, which are coupled to storage line 130 by storage-element vias 134.

In operation 340, a group of source lines are formed over the storage elements, and each source line couples to a corresponding storage element. The source lines are formed extending in the y direction, orthogonal to the x direction of the storages line 130. The source lines can be formed using any suitable method, e.g., damascene or double damascene, or other methods. The source lines are formed to couple to the upper electrodes of the storage elements, electrically opposite the storage lines. The source lines may be formed to couple to, e.g., other memory devices, including other storage elements coupled to other storage lines, or to circuits that control voltages applied to upper electrodes to write bits to storage elements. In some embodiments, the upper electrodes are integral to the source lines, and the source lines are formed over the storage layers (as upper electrodes) to complete the formation of the storage elements.

Figure 4G:
Figure 4G:
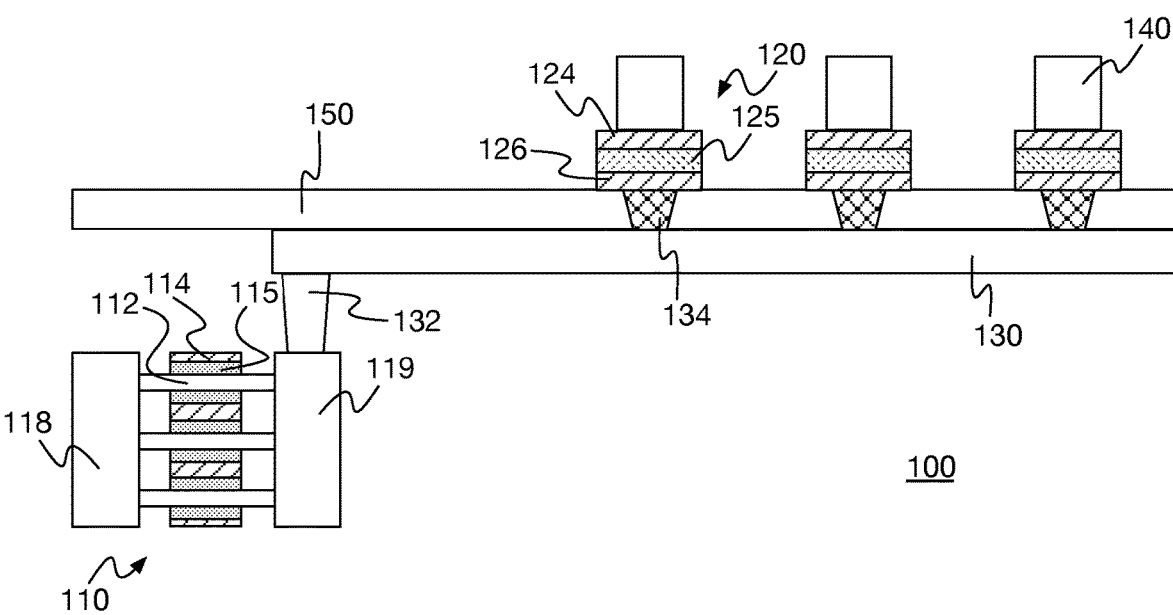
Figure 4G:
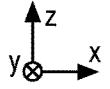

FIG. 4G shows IC die 100 and memory device 101 after source lines 140 have been formed over storage elements 120 (and upper electrodes 124). The source lines extend in the y direction, orthogonal to the x direction of the storages line 130, as well as to the viewing plane, where they may couple to other storage elements 120 storing other bits on other storage lines 130.

Figure 5A:
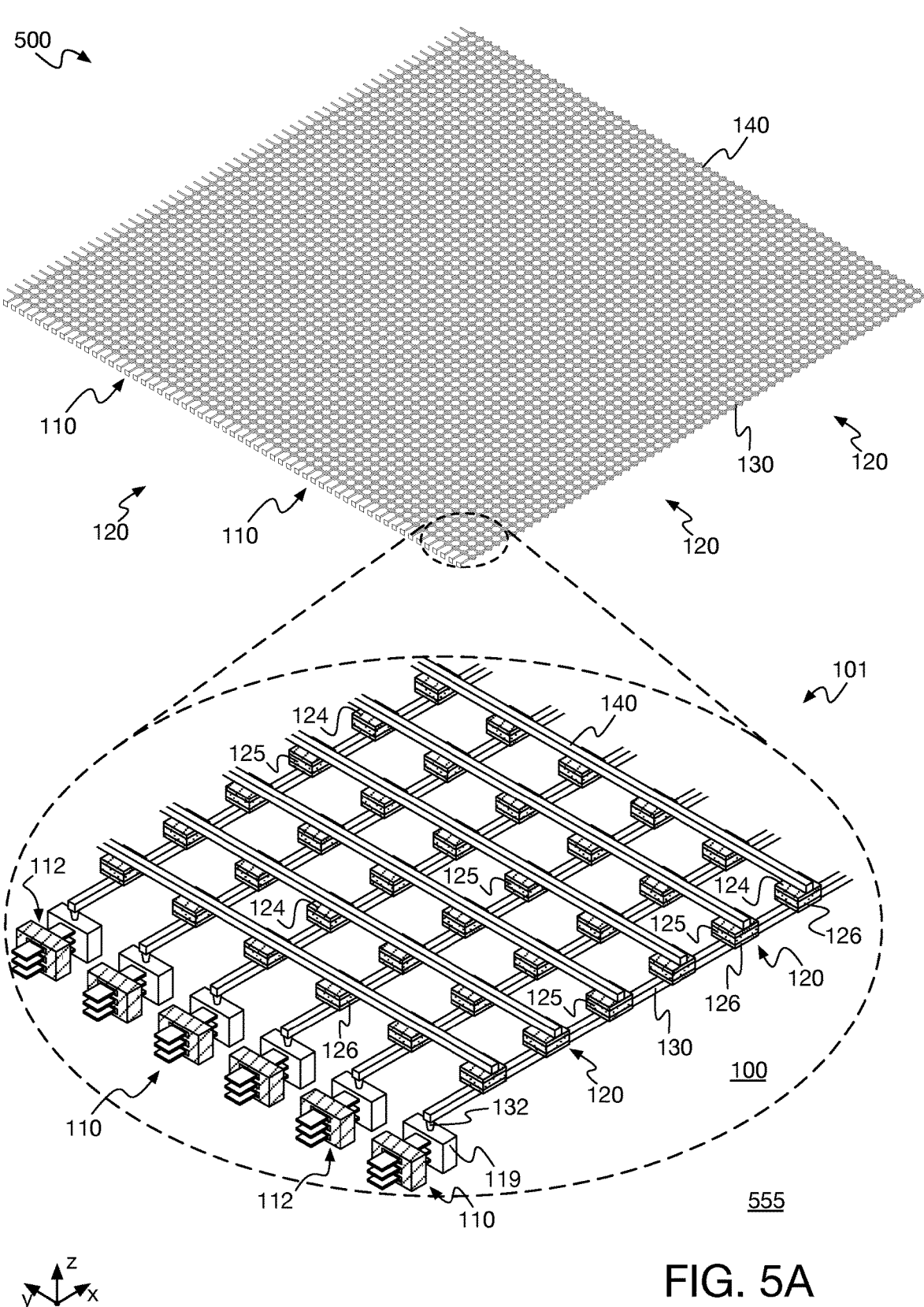
FIGS. 5A, 5B, and 5C illustrate isometric views of an IC system, including a large memory device with multiple access transistors and a large array of storage elements.
Figure 5B:
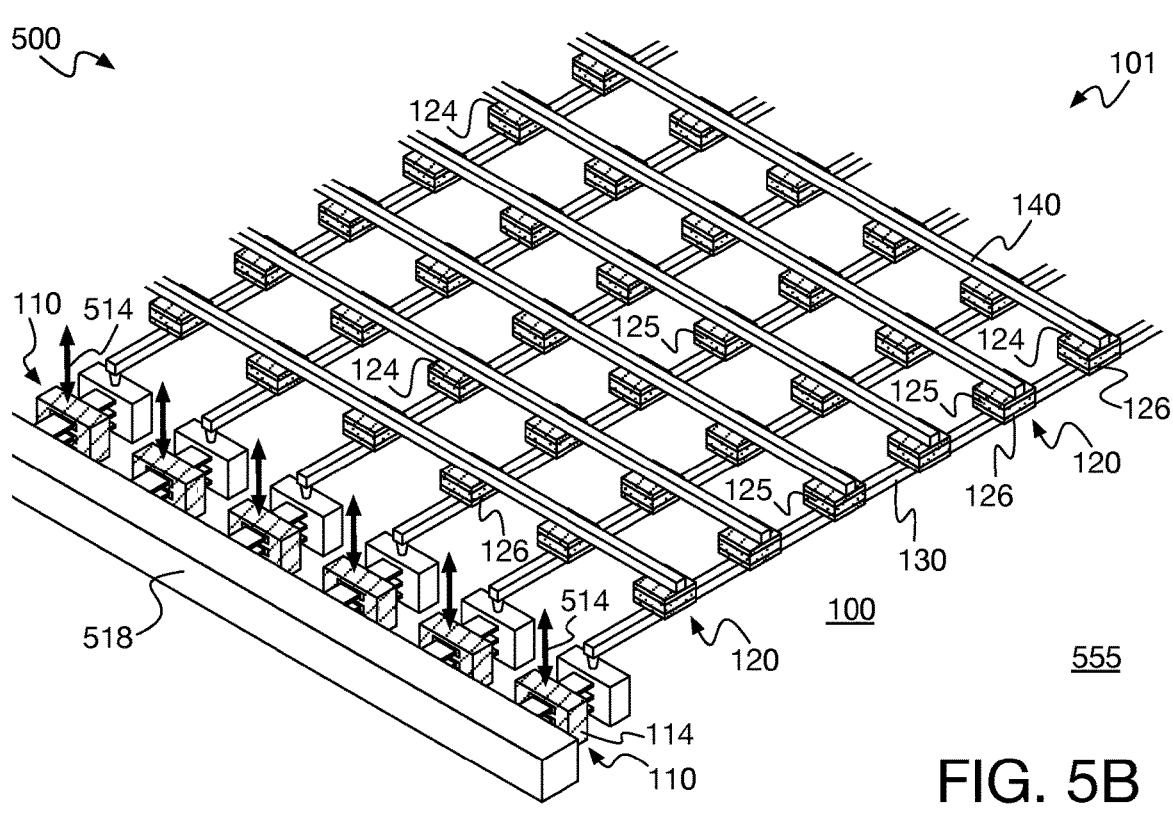
Figure 5C:
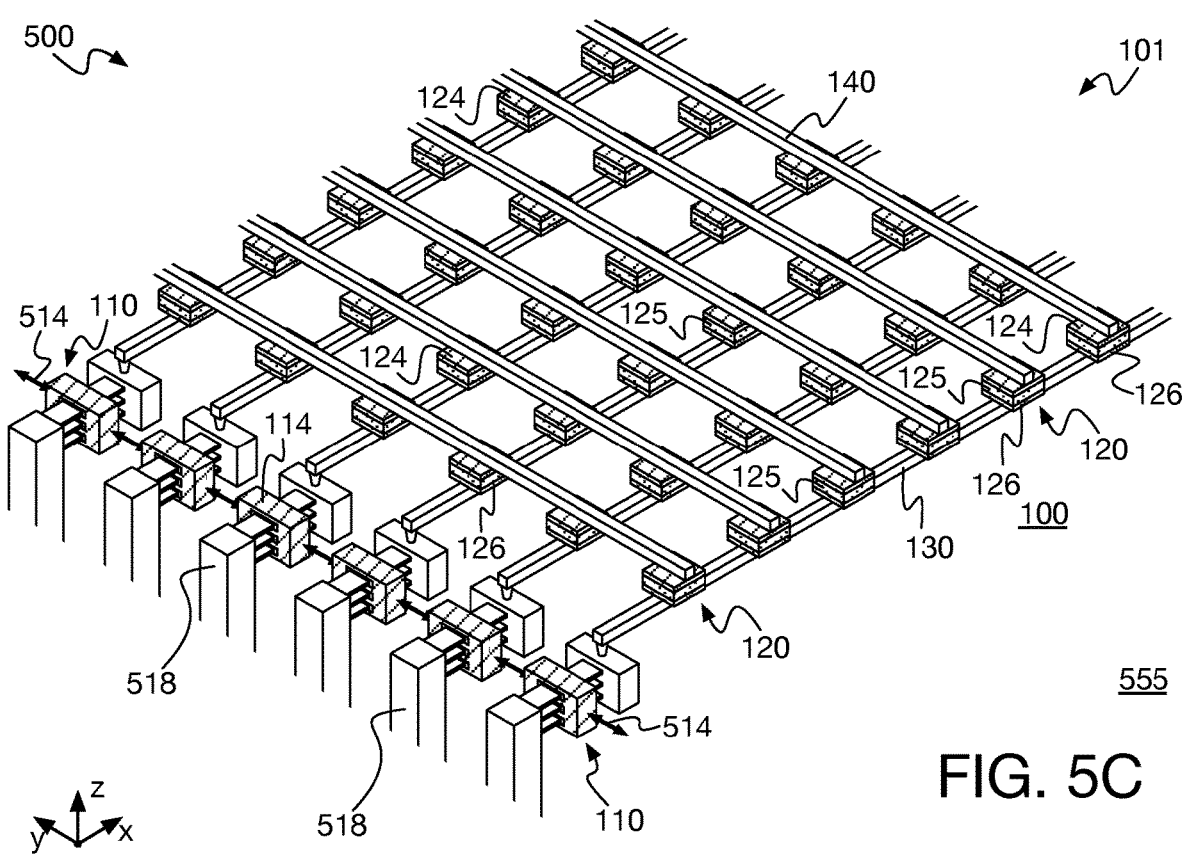

FIGS. 5A, 5B, and 5C illustrate isometric views of an IC system 500, including large memory device 101 with multiple access transistors 110 and a large array of storage elements 120, in accordance with some embodiments. IC die 100 and memory device 101 are much like those seen in FIGS. 1 and 2, but more and larger groups of storage elements 120 are on multiple storage lines 130. FIG. 5A shows IC die 100 having a large array of storage elements 120 with a magnified portion of the large array in the foreground illustrating greater detail for a portion of the array, including multiple groups of storage elements 120, each coupled to a single select transistor 110 on an array edge and storage line 130. FIGS. 5B and 5C show the magnified portion of the large array with possible wiring configurations for orthogonal bitlines 518 and wordlines 514.

FIG. 5A shows IC die 100 is coupled to a substrate 555. IC die 100 and its included memory device 101 are coupled to, and energized by, a power supply through substrate 555. Substrate 555 may be any host component with interconnect interfaces to IC die 100, such as a package substrate or interposer, another IC die, etc. Substrate 555 may bond to another host component, such as a package substrate or interposer, another IC die, etc.

A magnified portion of memory device 101 illustrates multiple groups of storage elements 120, each coupled to a single select transistor 110 and storage line 130. As seen in the array and the magnified portion, storage lines 130 are parallel to each other in a large group, and the many lines extend in the x direction. An equally large group of select transistors 110 are coupled to storage lines 130, one select transistor 110 for each storage line 130. Each storage line 130 is coupled to a source of the corresponding select transistor 110 at source contacts 119. Channels 112 of each select transistor 110 are between corresponding sources and drains, obscured without a cross-sectional view by the gate structures of their select transistors 110. Source lines 140 are parallel to each other in a large group, and the many lines extend in the y direction, orthogonal to the direction of storage lines 130. Source lines 140 and storage lines 130 are coupled to groups within the large array of storage elements 120. Each storage element 120 within the array includes storage layer 125 between lower electrode 126 and upper electrode 124. Each storage layer 125 includes storage material as discussed herein, e.g., in the description for FIG. 1. Each upper electrode 124 is coupled to a corresponding source line 140, and each lower electrode 126 is coupled to a corresponding storage line 130. Storage elements 120 coupled to a shared source line 140 are coupled to different storage lines 130, and storage elements 120 coupled to a shared storage line 130 are coupled to different source lines 140.

In some embodiments, IC system 500 includes a cooling structure capable of removing, and configured to remove, heat from IC die 100 to lower the operating temperature to below 0° C. In some such embodiments, the cooling structure is operable to remove heat from IC die 100 to achieve an operating temperature of 77K. In some embodiments, IC system 500 is thermally coupled to a cooling structure capable of removing, and configured to remove, heat from IC die 100 to lower the operating temperature to below 0° C. In some such embodiments, the cooling structure is operable to remove heat from IC die 100 to achieve an operating temperature of 77K. Low temperature operation may allow for improved performance such as improved mobility and reduced leakage that allow for very small dimensions of storage elements 120 and channels 112.

FIGS. 5B and 5C show possible wiring configurations for orthogonal bitlines 518 and wordlines 514. As discussed, storage elements 120 are controlled by coordinating the voltage levels on both upper and lower electrodes 124, 126 by source lines 140 and storage line 130 for each storage element 120 individually. Lower electrodes 126 are controlled by storage lines 130 (and corresponding select transistors 110), and upper electrodes 124 are controlled by their corresponding source lines 140. Each storage element 120 is programmed and accessed by a unique combination of storage line 130, source line 140, and, e.g., bitline 518 (coupled to select transistor 110 drain) and wordline 514 (coupled to gate electrode 114; indicated by separate vertical arrows in FIG. 5B or arrows indicating connections of gate electrodes 114 in FIG. 5C). The storage array of memory device 101 (and the bits corresponding to its constituent storage elements 120) can be programmed using signals on these lines.

As in FIG. 5B, the group of parallel source lines 140 may be parallel to bitline 518 and orthogonal to the direction of multiple wordlines 514 coupled to gate electrodes 114. A given wordline 514 selects a corresponding storage line 130. Source lines 140 are coupled and electrically connected to a group of upper electrodes 124, connecting upper electrodes 124 of storage elements 120 on different storage lines 130 and selected by different wordlines 514 on gate electrodes 114 of different select transistors 110. Storage lines 130 are coupled and electrically connected to a group of lower electrodes 126, connecting lower electrodes 126 of storage elements 120 on different source lines 140. A given combination of source line 140 and wordline 514 selects a single storage element 120 on the selected storage line 130, and the corresponding stored bit will be accessed by bitline 518.

As in FIG. 5C, the group of parallel source lines 140 may be parallel to wordline 514 coupled to gate electrodes 114 and orthogonal to the direction of multiple bitlines 518. Wordline 514 selects the group of storage lines 130. Source lines 140 are coupled and electrically connected to a group of upper electrodes 124, connecting upper electrodes 124 of storage elements 120 on different storage lines 130 and coupled to different bitlines 518 through different select transistors 110. Storage lines 130 are coupled and electrically connected to a group of lower electrodes 126, connecting lower electrodes 126 of storage elements 120 on different source lines 140. Though a given combination of source line 140 and wordline 514 selects a group of storage elements 120, each storage element 120 is on a different storage line 130 and bitline 518, and only one stored bit will be connected to any given bitline 518.

Figure 6:
FIG. 6 illustrates a cross-sectional view of a low-temperature IC system having an array of storage elements coupled to a single access transistor and using die- and package-level active cooling.

Crosspoint memory arrays with groups of storage elements 120 per select transistor 110 may advantageously be integrated into a low-temperature IC system 500, such as that shown in FIG. 6, for improved operation. For example, some suitable materials, such as semiconductor materials, have increased carrier mobility, reduced leakage currents, and reduced contact resistance (e.g., at the interfaces between semiconductor and metal) at low temperatures. Some storage materials have reduced disturb issues at the lower energy levels corresponding to lower temperatures. Such enhanced performance, e.g., conduction, can enable the use of, e.g., different materials and structures, such as smaller storage elements 120 or transistor channels 112. In some embodiments, access transistor channels as described (e.g., in fins, nanosheets, nanoribbons, or nanowires) have a thickness of 2 nm. In some embodiments, access transistor channels as described have a thickness of 1 nm. Lower temperatures may also enable the use of smaller storage elements 120 or voltages. Lower temperatures reduce disturb issues and leakage currents in many storage materials and can enable the use of, e.g., smaller storage elements 120 and smaller element-to-element pitches. In some embodiments, the group of storage elements 120 in memory device 101 has an element-to-element pitch of 100 nm. Yet lower temperatures can further enhance conditions and allow for yet smaller dimensions. In some embodiments, the group of storage elements 120 in memory device 101 has an element-to-element pitch of 15 nm. Smaller storage elements 120 and associated pitches enable increased memory density.

A number of structures may be used to lower the system temperature and so allow for the use of, e.g., smaller conducting structures. Active cooling structures can be used to lower system temperatures to below ambient temperature, even to well below ambient temperature. Active cooling structures can include thermoelectric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC dies 100. In some embodiments, active cooling structures include channels on one or more sides of IC dies 100. In some embodiments, active cooling structures include channels within IC dies 100. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to 0° C. or below. In some embodiments, active cooling structures lower system temperatures to 77K or below.

FIG. 6 illustrates a cross-sectional view of a low-temperature IC system 500 having crosspoint memory arrays with groups of storage elements 120 per select transistor 110 and using die- and package-level active cooling, in accordance with some embodiments. In the example of IC system 500, IC die 602 includes active-cooling structures or components as provided by both die-level microchannels 677 and package-level active-cooling structure 688. IC system 500 includes a lateral surface along the x-y plane that may be defined or taken at any vertical position of IC system 500. The lateral surface of the x-y plane is orthogonal to a vertical or build-up dimension as defined by the z-axis. In some embodiments, IC system 500 may be formed from any substrate material suitable for the fabrication of transistor circuitry. In some embodiments, a semiconductor substrate is used to manufacture non-planar access transistors 110 and other transistors and components of IC system 500. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 6, IC system 500 includes an IC die 602, which is a monolithic IC with crosspoint memory arrays as described above, including multiple storage elements 120 per access transistor 110, front-side metallization layers 604 (or front-side interconnect layers), and optional back-side metallization layers 605 (or back-side interconnect layers). As shown, access transistors 110 are embedded within a dielectric layer 650. As shown, each transistor 110 include transistor channels 112 (e.g., within nanosheets) and gate structures 613. Each of access transistors 110 also include source and drain structures, and source and drain contacts, which are not shown in the cross-section of FIG. 6. Within an array, source lines 140 connect groups of storage elements 120 sharing storage line 130 with groups sharing another storage line 130. In some embodiments, front-side metallization layers 604 provide signal routing to access transistors 110 and back-side metallization layers 605 provide power delivery, as enabled by through-contacts 614, to access transistors 110. In some embodiments, IC system 500 further includes a package-level cooling structure 688, which may be deployed on or over front-side metallization layers 604 (as shown) or on or over a back-side of IC die 602. In some embodiments, package-level cooling structure 688 is coupled to IC die 602 by an adhesion layer 616. IC system 500 may also be deployed without back-side metallization layers 605 shown in FIG. 6. In such embodiments, signal routing and power are provided to access transistors 110 via front-side metallization layers 604. However, use of back-side metallization layers 605 may offer advantages.

Access transistors 110 are connected and thermally coupled by metallization, e.g., metal heat spreader 644, to the entire metallization structure by through-contacts 614. In this way, access transistors 110 are thermally coupled to both the die-level active-cooling structures (of die-level microchannels 677) and package-level active-cooling structure 688.

Interconnectivity of access transistors 110 (and other transistors, etc.), signal routing to and from crosspoint memory arrays, etc., power delivery, etc., and routing to an outside device (not shown), is provided by front-side metallization layers 604, optional back-side metallization layers 605, and package-level interconnects 606. In the example of FIG. 6, package-level interconnects 606 are provided on or over a back-side of IC die 602 as bumps over a passivation layer 655, and IC system 500 is attached to a substrate 555 (and coupled to signal routing, power delivery, etc.) by package-level interconnects 606. However, package-level interconnects 606 may be provided using any suitable interconnect structures such as bond pads, solder bumps, etc. Furthermore, in some embodiments, package-level interconnects 606 are provided on or over a front-side of IC die 602 (i.e., over front-side metallization layers 604) and package-level cooling structure 688 is provided on or over a back-side of IC die 602.

In IC system 500, IC die 602 includes die-level, active-cooling as provided by die-level microchannels 677. Die-level microchannels 677 are to convey a heat transfer fluid therein to remove heat from IC die 602. The heat transfer fluid may be any suitable liquid or gas. In some embodiments, the heat transfer fluid is liquid nitrogen operable to lower the temperature of IC die 602 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 677 may be provided in any pattern in the x-y plane such as serpentine patterns, patterns of multiple parallel die-level microchannels 677, or the like. Die-level microchannels 677 couple to a heat exchanger (not shown) that removes heat from and cools the heat transfer fluid before re-introduction to die-level microchannels 677. The flow of fluid within die-level microchannels 677 may be provided by a pump or other fluid flow device. The operation of the heat exchanger, pump, etc. may be controlled by a controller.

In the illustrated embodiment, die-level microchannels 677 are implemented at metallization level M12. In other embodiments, die-level microchannels 677 are implemented over metallization level M12. Die-level microchannels 677 may be formed using any suitable technique or techniques such as patterning and etch techniques to form the void structures of die-level microchannels 677 and passivation or deposition techniques to form a cover structure 678 to enclose the void structures. As shown, in some embodiments, the die-level, active-cooling structure of IC system 500 includes a number of die-level microchannels 677 in IC die 602 and over a number of front-side metallization layers 604. As discussed, die-level microchannels 677 are to convey a heat transfer fluid therein. In some embodiments, a metallization feature 679 of metallization layer M12 is laterally adjacent to die-level microchannels 677. For example, metallization feature 679 may couple to a package-level interconnect structure (not shown) for signal routing for IC die 602. In some embodiments, a passive heat removal device such as a heat sink or the like may be used instead of or in addition to package-level cooling structure 688. In some embodiments, package-level cooling structure 688 is not deployed in IC system 500.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 651, are interconnected by vias, such as vias 652, that may be characterized as part of the metallization layers or between the metallization layers. As shown, in some embodiments, front-side metallization layers 604 are formed over and immediately adjacent access transistors 110. The back-side is then the opposite side, which may be exposed during processing by attaching the front-side to a carrier wafer and exposing the back-side (e.g., by back-side grind or etch operations) as known in the art.

In the illustrated example, front-side metallization layers 604 include M0, V0, M1, M2/V1, M3/V2, M4/V3, and M4-M12. However, front-side metallization layers 604 may include any number of metallization layers such as eight or more metallization layers. Similarly, back-side metallization layers 605 include BM0, BM1, BM2, and BM3. However, back-side metallization layers 605 may include any number of metallization layers such as two to five metallization layers. Front-side metallization layers 604 and back-side metallization layers 605 are embedded within dielectric materials 653, 654. Furthermore, optional metal-insulator-metal (MIM) devices such as diode devices may be provided within back-side metallization layers 605. Other devices such as capacitive memory devices may be provided within front-side metallization layers 604 and/or back-side metallization layers 605.

IC system 500 includes package-level active-cooling structure 688 having package-level microchannels 689. Package-level microchannels 689 are to convey a heat transfer fluid therein to remove heat from IC die 602. The heat transfer fluid may be any suitable liquid or gas as discussed with respect to die-level microchannels 677. Package-level microchannels 689 may be provided in any pattern in the x-y plane such as serpentine patterns, patterns of multiple parallel package-level microchannels 689, etc. Package-level microchannels 689 couple to a heat exchanger (not shown) that removes heat from and cools the heat transfer fluid before re-introduction to package-level microchannels 689. The flow of fluid within package-level microchannels 689 may be provided by a pump or other fluid-flow device. The operation of the heat exchanger, pump, etc. may be controlled by a controller. In the illustrated embodiment, package-level active-cooling structure 688 is a chiller mounted to IC die 602 such that the chiller has a solid body having microchannels therein to convey a heat transfer fluid.

In some embodiments, the heat-removal fluid deployed in die-level microchannels 677 and package-level active-cooling structure 688 are coupled to the same pump and heat exchanger systems. In such embodiments, the heat removal fluid conveyed in both die-level microchannels 677 and package-level active-cooling structure 688 are the same material. Such embodiments may advantageously provide simplicity. In other embodiments, the heat removal fluids are controlled separately. In such embodiments, the heat removal fluids conveyed by die-level microchannels 677 and package-level active-cooling structure 688 may be the same or they may be different. Such embodiments may advantageously provide improved flexibility.

As discussed, IC system 500 includes IC die 602 and optional die-level and package-level active-cooling structures operable to remove heat from IC die 602 to achieve a very low operating temperature of IC die 602. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. (e.g., 77K) may be used. In some embodiments, the operating temperature is in a cryogenic temperature operating window (e.g., about −180° C. to about −70° C.). The active-cooling structure may be provided as a package-level structure (i.e., separable from IC die 602), as a die-level structure (i.e., integral to IC die 602), or both. In some embodiments, IC die 602 is deployed in a cold environment, formed using sufficiently conductive materials, etc. and an active-cooling structure is not used.

Figure 7:
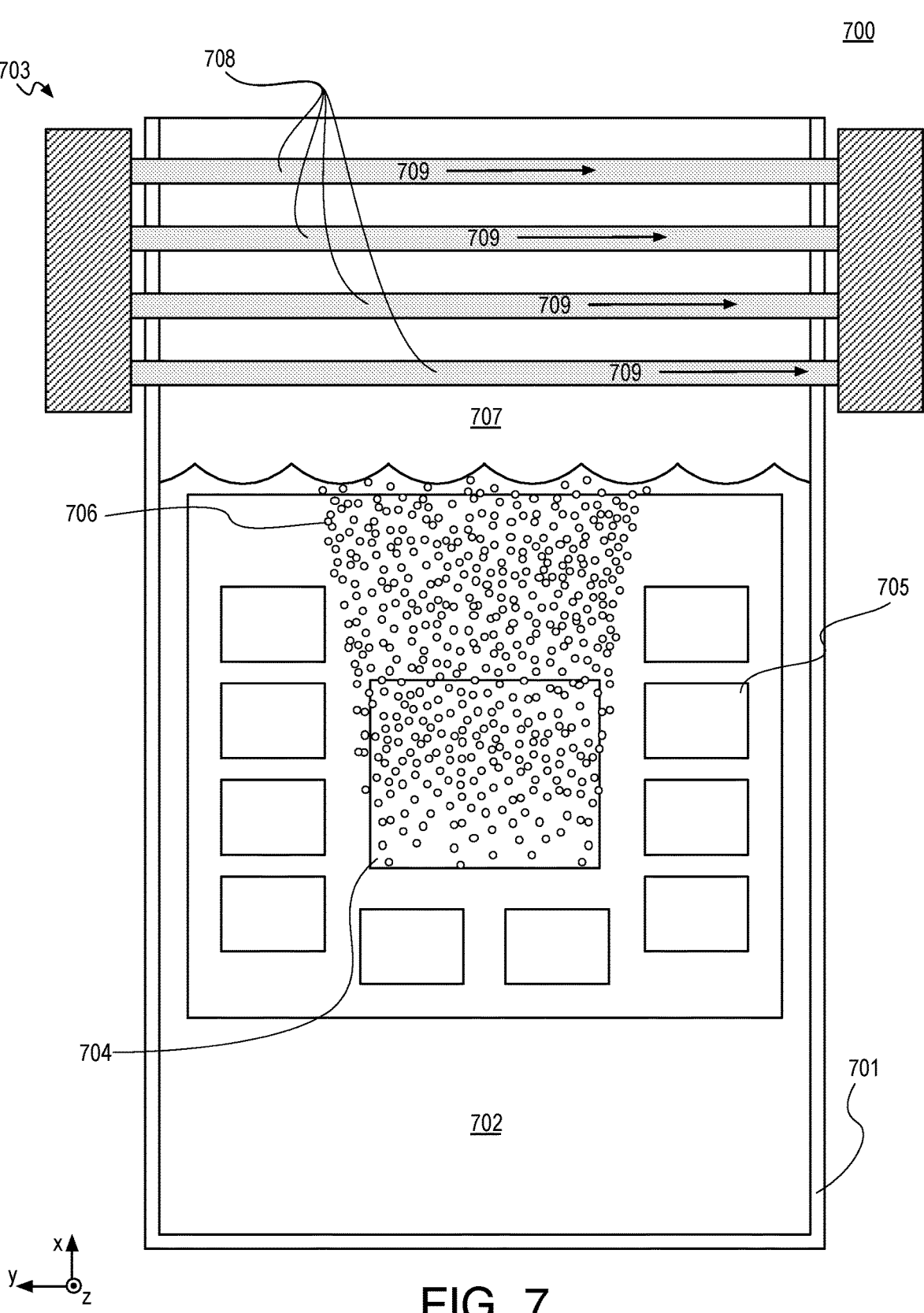
FIG. 7 illustrates a view of an example two-phase immersion cooling system for low-temperature operation of an IC system.

FIG. 7 illustrates a view of an example two-phase immersion cooling system for low-temperature operation of an IC system, in accordance with some embodiments. As shown, two-phase immersion cooling system 700 includes a fluid containment structure 701, a low-boiling point liquid 702 within fluid containment structure 701, and a condensation structure 703 at least partially within fluid containment structure 701. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 704, such as an IC package including any of IC dies or systems 100, 500 as discussed herein is immersed in low-boiling point liquid 702. In some embodiments, IC dies or systems 100, 500 as deployed in two-phase immersion cooling system 700 do not include additional active cooling structures, although such die-level or package-level active cooling structures may be used in concert with two-phase immersion cooling system 700. In some embodiments, when deployed in two-phase immersion cooling system 700, package-level active-cooling structure 688 is a heat sink, a heat dissipation plate, a porous heat dissipation plate or the like.

Notably, IC die 602 (or IC die 100), is the source of heat in the context of two-phase immersion cooling system 700.

For example, IC die 602 may be packaged and mounted on electronics substrate 705. Electronic substrate 705 may be coupled to a power supply (not shown) and may be partially or completely submerged in low-boiling point liquid 702.

In operation, the heat produced by heat generation source 704 vaporizes low-boiling point liquid 702 as shown in vapor or gas state as bubbles 706, which may collect, due to gravitational forces, above low-boiling point liquid 702 as a vapor portion 707 within fluid containment structure 701. Condensation structure 703 may extend through vapor portion 707. In some embodiments, condensation structure 703 is a heat exchanger having a number of tubes 708 with a cooling fluid (i.e., a fluid colder than the condensation point of vapor portion 707) shown by arrows 709 that may flow through tubes 708 to condense vapor portion 707 back to low-boiling point liquid 702. In the IC system of FIG. 7, package-level active-cooling structure 688 includes a passive cooling structure such as a heat sink for immersion in low-boiling point liquid 702.

Figure 8:
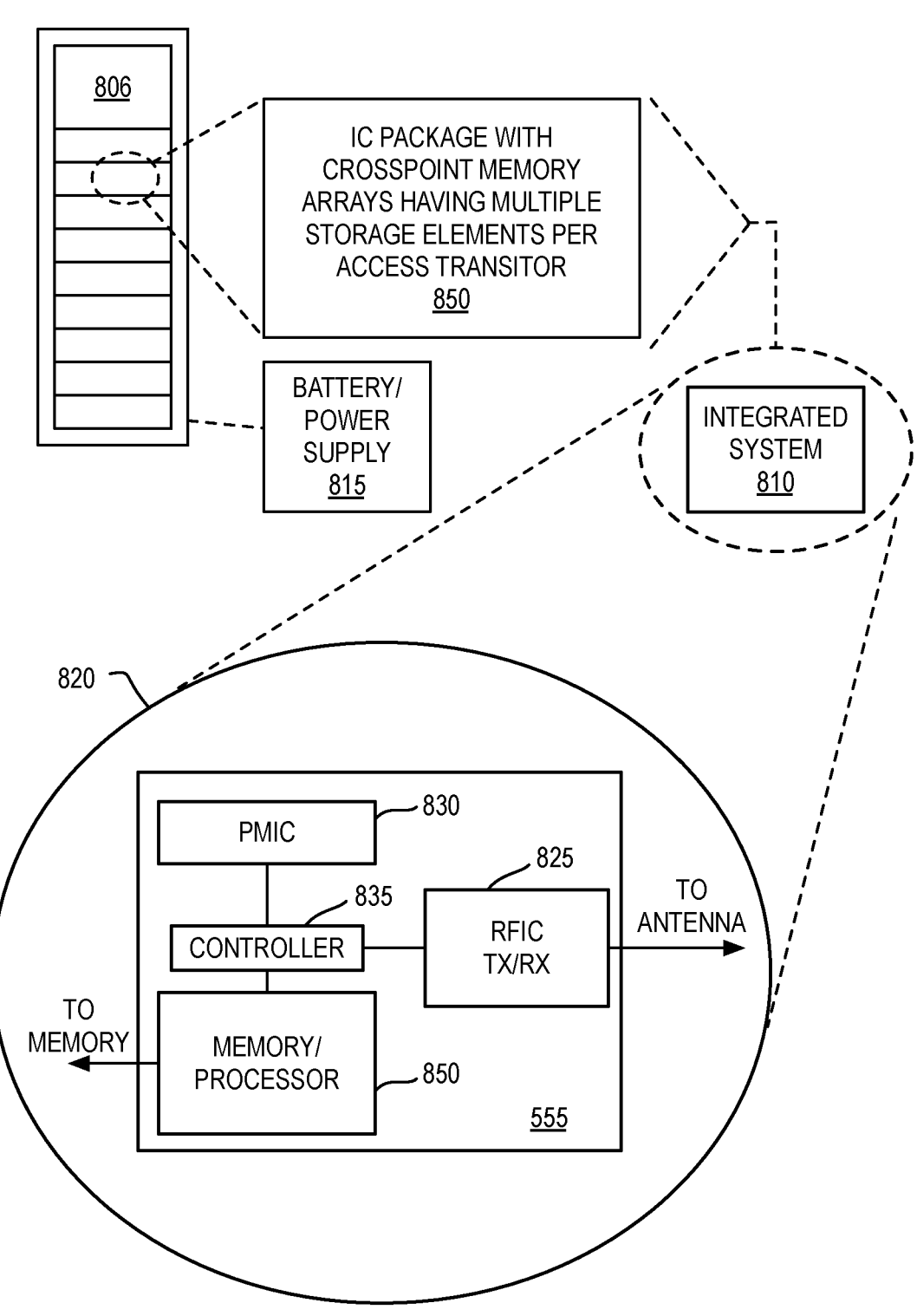
FIG. 8 illustrates a diagram of an example data server machine employing an IC system having multiple memory arrays with single access transistors.

FIG. 8 illustrates a diagram of an example data server machine employing an IC system having crosspoint memory arrays with multiple storage elements per access transistor, in accordance with some embodiments. Server machine 806 may be any commercial server, for example, including any number of high-performance computing platforms disposed within a rack and networked together for electronic data processing, which in the exemplary embodiment includes one or more devices 850 having multiple storage elements per access transistor.

Also as shown, server machine 806 includes a battery and/or power supply 815 to provide power to devices 850, and to provide, in some embodiments, power delivery functions such as power regulation. Devices 850 may be deployed as part of a package-level integrated system 810. Integrated system 810 is further illustrated in the expanded view 820. In the exemplary embodiment, devices 850 (labeled "Memory/Processor") includes at least one memory chip (e.g., with a crosspoint memory array as discussed herein), and/or at least one processor chip (e.g., a microprocessor, a multi-core microprocessor, or graphics processor, or the like) having the characteristics discussed herein. In an embodiment, device 850 is a microprocessor including a crosspoint memory as discussed herein. As shown, device 850 may be a multi-chip module employing one or more IC dies with a crosspoint memory array as discussed herein. Device 850 may be further coupled to (e.g., communicatively coupled to) a board, an interposer, or other substrate 555 along with, one or more of a power management IC (PMIC) 830, RF (wireless) IC (RFIC) 825, including a wideband RF (wireless) transmitter and/or receiver (TX/RX) (e.g., including a digital baseband and an analog front end module further comprises a power amplifier on a transmit path and a low noise amplifier on a receive path), and a controller 835 thereof. In some embodiments, RFIC 825, PMIC 830, controller 835, and device 850 include IC dies having a crosspoint memory array as discussed herein on substrate 555 in a multi-chip module.

FIG. 9 is a block diagram of an example computing device 900, in accordance with some embodiments. For example, one or more components of computing device 900 may include any of the devices or structures discussed herein. A number of components are illustrated in FIG. 9 as being included in computing device 900, but any one or more of these components may be omitted or duplicated, as suitable for the application. In some embodiments, some or all of the components included in computing device 900 may be attached to one or more printed circuit boards (e.g., a motherboard). In some embodiments, various ones of these components may be fabricated onto a single system-on-a-chip (SoC) die. Additionally, in various embodiments, computing device 900 may not include one or more of the components illustrated in FIG. 9, but computing device 900 may include interface circuitry for coupling to the one or more components. For example, computing device 900 may not include a display device 903, but may include display device interface circuitry (e.g., a connector and driver circuitry) to which display device 903 may be coupled. In another set of examples, computing device 900 may not include an audio output device 904, other output device 905, global positioning system (GPS) device 909, audio input device 910, or other input device 911, but may include audio output device interface circuitry, other output device interface circuitry, GPS device interface circuitry, audio input device interface circuitry, audio input device interface circuitry, to which audio output device 904, other output device 905, GPS device 909, audio input device 910, or other input device 911 may be coupled.

Computing device 900 may include a processing device 901 (e.g., one or more processing devices). As used herein, the term "processing device" or "processor" indicates a device that processes electronic data from registers and/or memory (such as a memory device including a crosspoint memory array as discussed herein) to transform that electronic data into other electronic data that may be stored in registers and/or memory. Processing device 901 may include a memory 921 (including a crosspoint memory array as discussed herein), a communication device 922, a refrigeration device 923, a battery/power regulation device 924, logic 925, interconnects 926 (i.e., optionally including redistribution layers (RDL) or metal-insulator-metal (MIM) devices), a heat regulation device 927, and a hardware security device 928.

Processing device 901 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 900 may include a memory 902, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 902 includes memory that shares a die with processing device 901. This memory may be used as cache memory and may include embedded dynamic random-access memory (eDRAM) or spin transfer torque magnetic random-access memory (STT-M RAM).

Computing device 900 may include a heat regulation/refrigeration device 906. Heat regulation/refrigeration device 906 may maintain processing device 901 (and/or other components of computing device 900) at a predetermined low temperature during operation. This predetermined low temperature may be any temperature discussed herein.

In some embodiments, computing device 900 may include a communication chip 907 (e.g., one or more communication chips). For example, the communication chip 907 may be configured for managing wireless communications for the transfer of data to and from computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 907 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 907 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 907 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 907 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 907 may operate in accordance with other wireless protocols in other embodiments. Computing device 900 may include an antenna 913 to facilitate wireless communications and/or to receive other wireless communications (such as AM or FM radio transmissions).

In some embodiments, communication chip 907 may manage wired communications, such as electrical, optical, or any other suitable communication protocols (e.g., the Ethernet). As noted above, communication chip 907 may include multiple communication chips. For instance, a first communication chip 907 may be dedicated to shorter-range wireless communications such as Wi-Fi or Bluetooth, and a second communication chip 907 may be dedicated to longer-range wireless communications such as GPS, EDGE, GPRS, CDMA, WiMAX, LTE, EV-DO, or others. In some embodiments, a first communication chip 907 may be dedicated to wireless communications, and a second communication chip 907 may be dedicated to wired communications.

Computing device 900 may include battery/power circuitry 908. Battery/power circuitry 908 may include one or more energy storage devices (e.g., batteries or capacitors) and/or circuitry for coupling components of computing device 900 to an energy source separate from computing device 900 (e.g., AC line power).

Computing device 900 may include a display device 903 (or corresponding interface circuitry, as discussed above). Display device 903 may include any visual indicators, such as a heads-up display, a computer monitor, a projector, a touchscreen display, a liquid crystal display (LCD), a light-emitting diode display, or a flat panel display, for example.

Computing device 900 may include an audio output device 904 (or corresponding interface circuitry, as discussed above). Audio output device 904 may include any device that generates an audible indicator, such as speakers, headsets, or earbuds, for example.

Computing device 900 may include an audio input device 910 (or corresponding interface circuitry, as discussed above). Audio input device 910 may include any device that generates a signal representative of a sound, such as microphones, microphone arrays, or digital instruments (e.g., instruments having a musical instrument digital interface (MIDI) output).

Computing device 900 may include a GPS device 909 (or corresponding interface circuitry, as discussed above). GPS device 909 may be in communication with a satellite-based system and may receive a location of computing device 900, as known in the art.

Computing device 900 may include other output device 905 (or corresponding interface circuitry, as discussed above). Examples of the other output device 905 may include an audio codec, a video codec, a printer, a wired or wireless transmitter for providing information to other devices, or an additional storage device.

Computing device 900 may include other input device 911 (or corresponding interface circuitry, as discussed above). Examples of the other input device 911 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 900 may include a security interface device 912. Security interface device 912 may include any device that provides security measures for computing device 900 such as intrusion detection, biometric validation, security encode or decode, access list management, malware detection, or spyware detection.

Computing device 900, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-9. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a memory device comprises an access transistor comprising a channel between a source and a drain, a storage line coupled to the source or the drain, the storage line extending in a first direction, a plurality of storage elements, wherein individual ones of the storage elements comprise a first electrode, a second electrode, and a storage layer therebetween, and wherein each of the first electrodes of the individual ones of the first electrodes are coupled to the storage line, and a plurality of source lines, the source lines extending in a second direction substantially orthogonal to the first direction, wherein individual ones of the source lines are coupled to corresponding ones of the second electrodes.

In one or more second embodiments, further to the first embodiments, the storage layer comprises oxygen and at least one of aluminum, hafnium, magnesium, tantalum, titanium, tungsten, or zirconium.

In one or more third embodiments, further to the first or second embodiments, the storage layer comprises nitrogen, cobalt, iron, germanium, gallium, copper, manganese, nickel, or palladium.

In one or more fourth embodiments, further to the first through third embodiments, the storage layer comprises titanium and oxygen and at least one of lead, strontium, or barium.

In one or more fifth embodiments, further to the first through fourth embodiments, the storage layer comprises sulfur, selenium, or tellurium.

In one or more sixth embodiments, further to the first through fifth embodiments, the plurality of storage elements has an element-to-element pitch of at least 15 nm and not more than 100 nm.

In one or more seventh embodiments, further to the first through sixth embodiments, the access transistor is a non-planar transistor, and the channel is within one of a substantially vertical fin, a nanosheet, or a nanowire.

In one or more eighth embodiments, further to the first through seventh embodiments, the access transistor is a non-planar transistor, and a thickness of the channel is not more than 2 nm.

In one or more ninth embodiments, an integrated circuit (IC) system comprises a power supply, the power supply coupled to an IC die, the IC die comprising a plurality of storage lines extending in a first direction, a plurality of select transistors, wherein individual ones of the select transistors comprise a channel between a source and a drain, and individual ones of the sources or drains are coupled to individual ones of the storage lines, a plurality of source lines, the source lines extending in a second direction substantially orthogonal to the first direction, and an array of storage elements, wherein individual ones of the storage elements comprise a first electrode, a second electrode, and a storage layer therebetween, individual ones of the first electrodes are coupled to corresponding ones of the storage lines, and individual ones of the second electrodes are coupled to corresponding ones of the source lines.

In one or more tenth embodiments, further to the ninth embodiments, the IC system comprises or is thermally coupled to a cooling structure, the cooling structure operable to remove heat from the IC die to achieve an operating temperature at or below 0° C.

In one or more eleventh embodiments, further to the ninth or tenth embodiments, the select transistor is a non-planar transistor, and a thickness of the channel is not more than 2 nm.

In one or more twelfth embodiments, further to the ninth through eleventh embodiments, the storage layer comprises oxygen and at least one of aluminum, hafnium, magnesium, tantalum, titanium, tungsten, or zirconium.

In one or more thirteenth embodiments, further to the ninth through twelfth embodiments, the storage layer comprises nitrogen, cobalt, iron, germanium, gallium, copper, manganese, nickel, or palladium.

In one or more fourteenth embodiments, further to the ninth through thirteenth embodiments, the storage layer comprises titanium and oxygen and at least one of lead, strontium, or barium.

In one or more fifteenth embodiments, further to the ninth through fourteenth embodiments, the storage layer comprises sulfur, selenium, or tellurium.

In one or more sixteenth embodiments, a method comprises receiving a substrate, the substrate comprising a transistor, forming a storage line, the storage line coupled to a source or a drain of the transistor, and the storage line extending in a first direction, forming a plurality of storage elements over the storage line, wherein individual ones of the storage elements are coupled to the storage line, and individual ones of the storage elements comprise a first electrode, a second electrode, and a storage material therebetween, and forming a plurality of source lines over the storage elements, wherein the source lines extend in a second direction substantially orthogonal to the first direction, and individual ones of the source lines are coupled to corresponding ones of the storage elements.

In one or more seventeenth embodiments, further to the sixteenth embodiments, forming said plurality of storage elements comprises forming a first electrode layer, the first electrode layer comprising or over the storage line, forming a storage layer over the first electrode layer, the storage layer comprising the storage material, forming a second electrode layer, the second electrode layer over the storage layer, and removing portions of the first electrode layer, the storage layer, and the second electrode layer.

In one or more eighteenth embodiments, further to the sixteenth or seventeenth embodiments, the storage layer comprises oxygen and at least one of aluminum, hafnium, magnesium, tantalum, titanium, tungsten, or zirconium.

In one or more nineteenth embodiments, further to the sixteenth through eighteenth embodiments, the storage layer comprises nitrogen, cobalt, iron, germanium, gallium, copper, manganese, nickel, or palladium.

In one or more twentieth embodiments, further to the sixteenth through nineteenth embodiments, the storage layer comprises titanium and oxygen and at least one of lead, strontium, or barium.

In one or more twenty-first embodiments, further to the sixteenth through twentieth embodiments, the storage layer comprises sulfur, selenium, or tellurium.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A memory device, comprising:
an access transistor comprising a channel between a source and a drain, wherein the access transistor is a non-planar transistor, and the channel is within one of a substantially vertical fin, a nanosheet, or a nanowire;
a storage line coupled to the source or the drain, the storage line extending in a first direction;
a plurality of storage elements, wherein individual ones of the storage elements comprise a first electrode, a second electrode, and a storage layer therebetween, and wherein each of the first electrodes of the individual ones of the first electrodes are coupled to the storage line; and
a plurality of source lines, the source lines extending in a second direction substantially orthogonal to the first direction, wherein individual ones of the source lines are coupled to corresponding ones of the second electrodes.

2. The memory device of claim 1, wherein the storage layer comprises oxygen and at least one of aluminum, hafnium, magnesium, tantalum, titanium, tungsten, or zirconium.

3. The memory device of claim 1, wherein the storage layer comprises nitrogen, cobalt, iron, germanium, gallium, copper, manganese, nickel, or palladium.

4. The memory device of claim 1, wherein the storage layer comprises titanium and oxygen and at least one of lead, strontium, or barium.

5. The memory device of claim 1, wherein the storage layer comprises sulfur, selenium, or tellurium.

6. The memory device of claim 1, wherein the plurality of storage elements has an element-to-element pitch of at least 15 nm and not more than 100 nm.

7. The memory device of claim 1, wherein the access transistor is a non-planar transistor, and a thickness of the channel is not more than 2 nm.

8. An integrated circuit (IC) system, comprising:
   a power supply, the power supply coupled to an IC die, the IC die comprising:
      a plurality of storage lines extending in a first direction;
      a plurality of select transistors, wherein individual ones of the select transistors comprise a channel between a source and a drain, and individual ones of the sources or drains are coupled to individual ones of the storage lines;
      a plurality of source lines, the source lines extending in a second direction substantially orthogonal to the first direction; and
      an array of storage elements, wherein individual ones of the storage elements comprise a first electrode, a second electrode, and a storage layer therebetween, individual ones of the first electrodes are coupled to corresponding ones of the storage lines, and individual ones of the second electrodes are coupled to corresponding ones of the source lines.

9. The IC system of claim 8, wherein the IC system comprises or is thermally coupled to a cooling structure, the cooling structure operable to remove heat from the IC die to achieve an operating temperature at or below 0° C.

10. The IC system of claim 9, wherein each of the select transistors is a non-planar transistor, and a thickness of the channel is not more than 2 nm.

11. The IC system of claim 8, wherein the storage layer comprises oxygen and at least one of aluminum, hafnium, magnesium, tantalum, titanium, tungsten, or zirconium.

12. The IC system of claim 8, wherein the storage layer comprises nitrogen, cobalt, iron, germanium, gallium, copper, manganese, nickel, or palladium.

13. The IC system of claim 8, wherein the storage layer comprises titanium and oxygen and at least one of lead, strontium, or barium.

14. The IC system of claim 8, wherein the storage layer comprises sulfur, selenium, or tellurium.

15. A method, comprising:
   receiving a substrate, the substrate comprising a transistor;
   forming a storage line, the storage line coupled to a source or a drain of the transistor, and the storage line extending in a first direction;
   forming a plurality of storage elements over the storage line, wherein individual ones of the storage elements are coupled to the storage line, and individual ones of the storage elements comprise a first electrode, a second electrode, and a storage material therebetween, wherein forming said plurality of storage elements comprises:
      forming a first electrode layer, the first electrode layer comprising or over the storage line;
      forming a storage layer over the first electrode layer, the storage layer comprising the storage material;
      forming a second electrode layer, the second electrode layer over the storage layer; and
      removing portions of the first electrode layer, the storage layer, and the second electrode layer; and
   forming a plurality of source lines over the storage elements, wherein the source lines extend in a second direction substantially orthogonal to the first direction, and individual ones of the source lines are coupled to corresponding ones of the storage elements.

16. The method of claim 15, wherein the storage layer comprises oxygen and at least one of aluminum, hafnium, magnesium, tantalum, titanium, tungsten, or zirconium.

17. The method of claim 15, wherein the storage layer comprises nitrogen, cobalt, iron, germanium, gallium, copper, manganese, nickel, or palladium.

18. The method of claim 15, wherein the storage layer comprises titanium and oxygen and at least one of lead, strontium, or barium.

19. The method of claim 15, wherein the storage layer comprises sulfur, selenium, or tellurium.

* * * * *